(12) United States Patent
Lee et al.

(10) Patent No.: US 11,594,267 B2
(45) Date of Patent: Feb. 28, 2023

(54) MEMORY DEVICE FOR RECEIVING ONE CLOCK SIGNAL AS A MULTI-LEVEL SIGNAL AND RESTORING ORIGINAL DATA ENCODED INTO THE CLOCK SIGNAL AND METHOD OF OPERATING THE SAME

(71) Applicant: Samsung Electronics Co., Ltd., Suwon-si (KR)

(72) Inventors: Mingyu Lee, Suwon-si (KR); Jaewoo Park, Yongin-si (KR); Younghoon Son, Yongin-si (KR); Youngdon Choi, Seoul (KR); Hyungmin Jin, Suwon-si (KR); Junghwan Choi, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/230,403

(22) Filed: Apr. 14, 2021

(65) Prior Publication Data

US 2022/0068331 A1 Mar. 3, 2022

(30) Foreign Application Priority Data

Sep. 3, 2020 (KR) .......................... 10-2020-0112481

(51) Int. Cl.
*G11C 7/22* (2006.01)
*G11C 7/06* (2006.01)
*G06F 13/16* (2006.01)

(52) U.S. Cl.
CPC .......... *G11C 7/222* (2013.01); *G06F 13/1668* (2013.01); *G11C 7/06* (2013.01)

(58) Field of Classification Search
CPC .................................. G11C 7/222; G11C 7/06
USPC .......................................................... 365/193
See application file for complete search history.

(56) References Cited

U.S. PATENT DOCUMENTS

| | | | |
|---|---|---|---|
| 6,215,726 B1 * | 4/2001 | Kubo | G11C 7/1078 365/194 |
| 9,172,567 B2 | 10/2015 | Hollis | |
| 9,767,873 B2 | 9/2017 | Lee et al. | |
| 9,794,054 B2 | 10/2017 | Nandy et al. | |
| 10,425,260 B2 | 9/2019 | Hollis et al. | |
| 10,447,512 B2 | 10/2019 | Lin et al. | |
| 10,599,606 B2 | 3/2020 | Lee et al. | |
| 2004/0027862 A1 * | 2/2004 | Oh | G11C 11/40615 365/189.05 |

(Continued)

FOREIGN PATENT DOCUMENTS

KR  10-2109591 B1  5/2020

*Primary Examiner* — Connie C Yoha
(74) *Attorney, Agent, or Firm* — Harness, Dickey & Pierce, P.L.C.

(57) ABSTRACT

A method of operating a memory device including receiving a multilevel signal having M levels transmitted by an external controller through a clock receiving pin, where M is a natural number greater than 2, and decoding the multilevel signal to restore at least one of Data Bus Inversion (DBI) data, Data Mask (DM) data, Cyclic Redundancy Check (CRC) data, or Error Correction Code (ECC) data may be provided. The multilevel signal is a clock signal transmitted by the external controller, and is a signal swinging based on an intermediate reference signal that is an intermediate value between a minimum level and a maximum level among the M levels.

20 Claims, 17 Drawing Sheets

(56) References Cited

U.S. PATENT DOCUMENTS

| | | |
|---|---|---|
| 2006/0170453 A1 | 8/2006 | Zerbe et al. |
| 2010/0271886 A1 | 10/2010 | Park et al. |
| 2019/0273640 A1 | 9/2019 | Lin et al. |
| 2019/0305765 A1 | 10/2019 | Lee et al. |
| 2020/0233832 A1* | 7/2020 | Jamadagni .......... G06F 13/4291 |

* cited by examiner

MEMORY DEVICE FOR RECEIVING ONE CLOCK SIGNAL AS A MULTI-LEVEL SIGNAL AND RESTORING ORIGINAL DATA ENCODED INTO THE CLOCK SIGNAL AND METHOD OF OPERATING THE SAME

CROSS-REFERENCE TO RELATED APPLICATION(S)

This application claims the benefit under 35 USC 119(a) of Korean Patent Application No. 10-2020-0112481 filed on Sep. 3, 2020 in the Korean Intellectual Property Office, the entire disclosure of which is incorporated herein by reference for all purposes.

BACKGROUND

The present inventive concepts relate to memory devices, methods of operating the same, and/or memory systems.

Memory devices may provide a function of writing and erasing data or reading recorded data in response to control signals received from one or more external controllers. A memory device may receive data from a controller and store the received data in memory cells, and to improve a communication speed between the memory device and the controller, at least one communication channel may use a multilevel signal different from a non-return-zero (NRZ) signal.

SUMMARY

Some example embodiments provide memory devices in which the number of pins is reduced and power consumption may be lowered by generating a clock signal and a data strobe signal as a multilevel signal and transmitting the generated signal together with data, methods of operating the same, and/or memory systems.

According to an example embodiment, a method of operating a memory device may include receiving a multi-level signal having M levels transmitted by an external controller through a clock receiving pin, where M is a natural number greater than 2), and decoding the multilevel signal to store at least one of Data Bus Inversion (DBI) data, Data Mask (DM) data, Cyclic Redundancy Check (CRC) data, or Error Correction Code (ECC) data. The multilevel signal may be a clock signal transmitted by the external controller, and may be a signal swinging based on an intermediate reference signal having an intermediate level between a minimum level and a maximum level among the M levels.

According to an example embodiment, a method of operating a memory device may include receiving a data strobe signal transmitted by an external controller through a DQS pin, the data strobe signal having M levels, where M is a natural number greater than 2, and decoding the data strobe signal and restoring data that is encoded into the data strobe signal by the external controller. The data strobe signal may be a signal swinging based on an intermediate level between a minimum level and a maximum level among the M levels.

According to an example embodiment, a memory device may include a buffer configured to receive a multilevel signal having M levels through a DQS pin, where M is a natural number greater than 2, a delay circuit configured to generate a delayed clock signal by delaying the multilevel signal, a first sense amplifier configured to generate a first output signal based on the data strobe signal and a first reference signal at a rising edge and a falling edge of the reference clock signal, a second sense amplifier configured to generate a second output signal based on the data strobe signal and a second reference signal greater than the first reference signal at the rising edge and the falling edge of the delayed clock signal, and a decoder configured to restore at least one of DBI data, DM data, CRC data, or ECC data that is encoded into the multilevel signal, using at least one of the first output signal and the second output signal.

According to an example embodiment, a memory system may include a memory device having a plurality of memory cells, and a controller connected to the memory device through an interface. The controller may be configured to transmit a clock signal and a data strobe signal to the memory device, and at least one of the clock signal or the data strobe signal may be a pulse amplitude modulated signal. The controller may be further configured to transmit at least one of DBI data, ECC data, CRC data, data mask data, or command/address data to the memory device, using the pulse amplitude modulated signal. The pulse amplitude modulated signal may be a multilevel signal having multiple levels, and may swing based on an intermediate reference signal having an intermediate level between a minimum level and a maximum level among the multiple levels.

According to an example embodiment, a memory device may include a plurality of pins connected to an external controller, the external controller configured to exchange a signal with the memory device through the plurality of pins, and a plurality of memory cells configured to store data. The memory device may be configured to receive a clock signal or a data strobe signal as a pulse amplitude modulated signal through at least one of the plurality of pins, the pulse amplitude modulated signal may include at least one of DBI data, ECC data, CRC data, data mask data, or command/address data, and the pulse amplitude modulated signal may be a multilevel signal having multiple levels and may swing based on an intermediate reference signal having an intermediate level of a minimum level and a maximum level among the multiple levels.

BRIEF DESCRIPTION OF DRAWINGS

The above and other aspects, features, and advantages of the present inventive concepts will be more clearly understood from the following detailed description, taken in conjunction with the accompanying drawings, in which.

DETAILED DESCRIPTION

Hereinafter, some example embodiments will be described with reference to the accompanying drawings.

Figure 1:
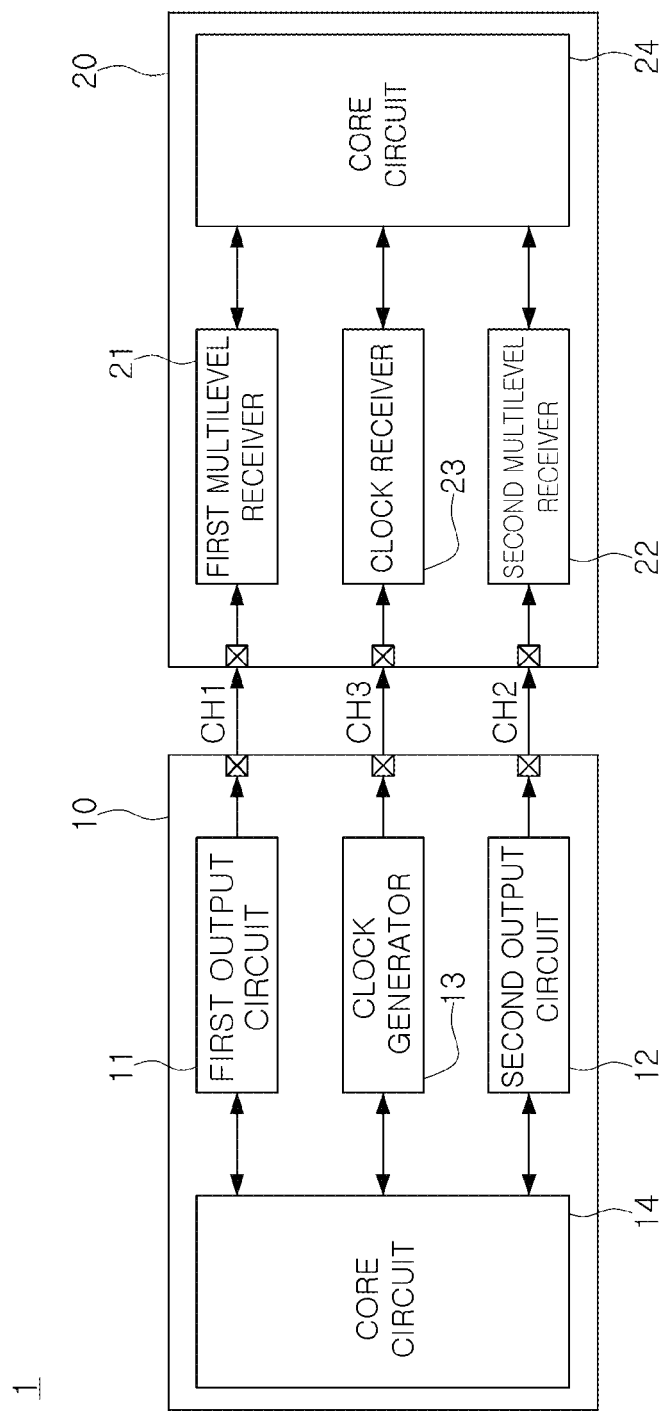
FIG. 1 is a schematic diagram of a system including a memory device according to an example embodiment.

FIG. 1 is a schematic diagram of a system including a memory device according to an example embodiment.

Referring to FIG. 1, a system 1 according to an example embodiment may include a first semiconductor device 10 and a second semiconductor device 20 that exchange data with each other. In the system 1 according to the example embodiment illustrated in FIG. 1, the first semiconductor device 10 may transmit data to the second semiconductor device 20. The first semiconductor device 10 may be a processor such as a central processing unit, an Application Processor (AP), or a system-on-chip, and the second semiconductor device 20 may be a memory device storing data.

For example, the first semiconductor device 10 may transmit a data signal and a clock signal to the second semiconductor device 20. The first semiconductor device 10 may include a first output circuit 11 and a second output circuit 12 transmitting a data signal, a clock generator 13 transmitting a clock signal, a core circuit 14 controlling the overall operation of the first semiconductor device 10, and the like. The second semiconductor device 20 may include a first multilevel receiver 21 and a second multilevel receiver 22 receiving the data signal, a clock receiver 23 receiving the clock signal, a core circuit 24 controlling the overall operation of the second semiconductor device 20, and the like.

Each of the first and second output circuits 11 and 12 may transmit a data signal as a multilevel signal. Accordingly, each of the data signals transmitted through a first communication channel CH1 and a second communication channel CH2 may be a multilevel signal having M levels, and M may be a natural number greater than 2. For example, M may be a power of 2, and may be determined depending on the amount of data to be transmitted through each of the first and second communication channels CH1 and CH2. However, According to some example embodiments, the outputs of the respective first and second output circuits 11 and 12 may also be generated as a non-return zero (NRZ) signal, rather than a multilevel signal.

The clock generator 13 may transmit an external clock signal to the second semiconductor device 20 through a third communication channel CH3. In an example embodiment, an external clock signal may also be generated as a multi-level signal similar to a data signal and transmitted to the second semiconductor device 20. According to some example embodiments, the number of levels that the external clock signal may have, and the number of levels that the data signal may have, may be the same or different from each other.

The first multilevel receiver 21 and the second multilevel receiver 22 may receive and restore a data signal. For example, the first multilevel receiver 21 may include N sense amplifiers each receiving a multilevel signal having one of the M levels and a reference signal. N may be a natural number lower than M defining the multilevel signal, and a decoder restoring the outputs of the N sense amplifiers may be further included in the first multilevel receiver 21. The configuration and operation of the second multilevel receiver 22 may be the same or substantially similar to that of the first multilevel receiver 21.

The clock receiver 23 may also include a plurality of sense amplifiers. For example, the clock receiver 23 may include a first sense amplifier comparing an external clock signal received through the third communication channel CH3 with a first reference signal, and a second sense amplifier comparing the external clock signal with a second reference signal. The level of the first reference signal may be different from the level of the second reference signal. In other words, the clock receiver 23 may include a first sense amplifier, which operates based on the external clock signal received through the third communication channel CH3 and the first reference signal, and a second sense amplifier that operates based on the external clock signal and the second reference signal.

Also, the clock receiver 23 may include a decoder that generates desired (or alternatively, predetermined) data using the output of the first sense amplifier and the output of the second sense amplifier. The data generated by the decoder may correspond to original data that the first semiconductor device 10 encodes with an external clock signal and transmits. For example, the decoder may generate one original data using the output of the first sense amplifier and the output of the second sense amplifier. In some example embodiment, the decoder may generate first original data using the output of the first sense amplifier, and may generate second original data using the output of the second sense amplifier.

The first semiconductor device 10 may encode the external clock signal, based on the original data, such that the second semiconductor device 20 may restore the original data, using the external clock signal. Accordingly, at least one pin for separately transmitting original data may be omitted, and the degree of integration of the semiconductor devices 10 and 20 may be improved and power consumption may be reduced.

Figure 2:
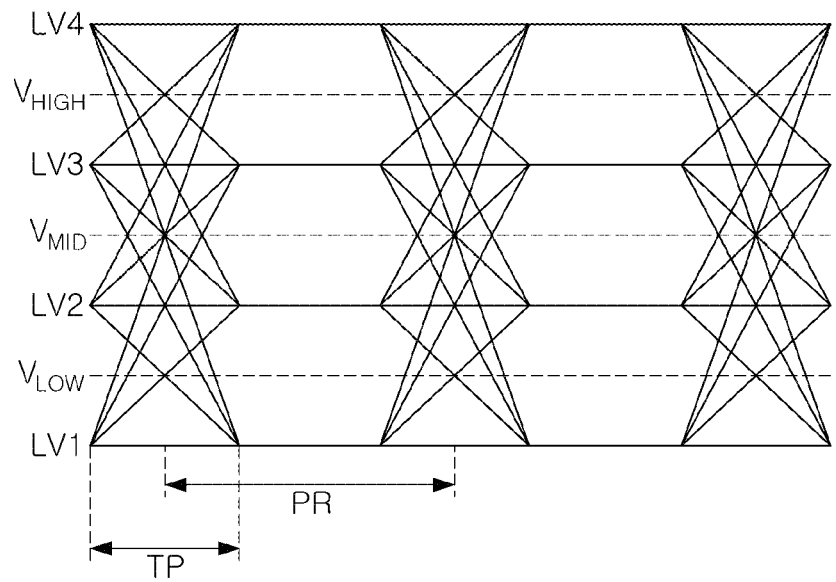
FIGS. 2 and 3 are diagrams illustrating a multilevel signal received by a memory device according to an example embodiment.
Figure 3:
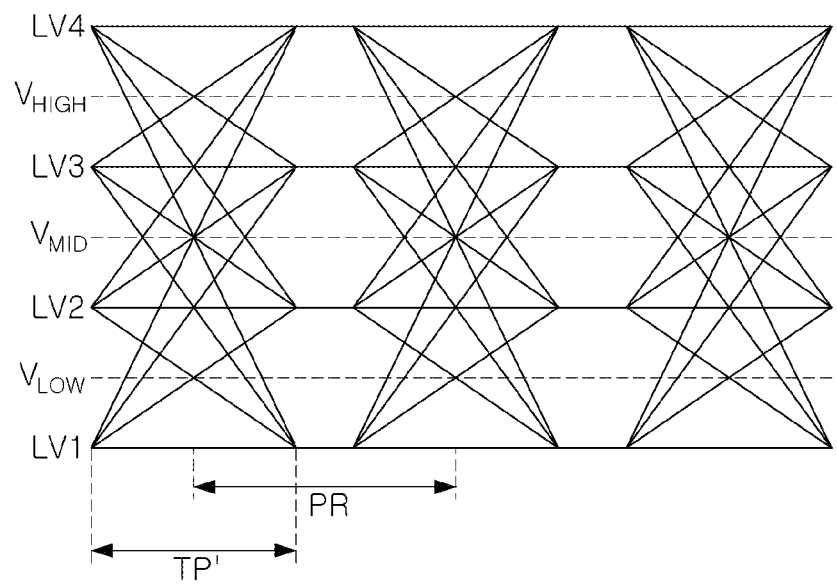

FIGS. 2 and 3 are diagrams illustrating a multilevel signal received by a memory device according to an example embodiment.

Referring to FIGS. 2 and 3, a multilevel signal received by a memory device according to an example embodiment may have four levels LV1-LV4. In the example embodiment illustrated in FIGS. 2 and 3, the memory device may receive a multilevel signal generated based on pulse amplitude modulation-4 (PAM-4). When data is received with a multilevel signal generated based on the pulse amplitude modulation-4, two data bits may be received during one data transmission period (PR).

For example, the four levels LV1 to LV4 may correspond to data of 00, 01, 10, and 11, respectively. Accordingly, the memory device may receive two bits, for example, one of 00, 10, 01, and 11 during one data transmission period PR. The memory device may include a multilevel receiver that receives a multilevel signal and restores data, and the multilevel receiver may include a plurality of sense amplifiers.

In an example embodiment, a clock signal transmitted and received by the memory device may be generated as a multilevel signal as in the example embodiment illustrated in FIGS. 2 and 3. The level of the clock signal generated as a multilevel signal may be increased or reduced, based on an intermediate reference signal $V_{MID}$, in a transition period (TP) between the data transmission periods (PR), unlike the multilevel signal generated for transmitting only data.

For example, when the level of the clock signal in the first data transmission period (PR) is the first level (LV1) or the second level (LV2), the level of the clock signal in the second data transmission period (PR) may be a third level (LV3) or a fourth level LV4. Similarly, when the level of the clock signal in the first data transmission period (PR) is the third level (LV3) or the fourth level (LV4), the level of the clock signal in the second data transmission period (PR) may be the first level (LV1) or the second level LV2.

On the other hand, the memory device receiving a clock signal as a multilevel signal may compare the clock signal with at least one of a low reference signal ($V_{LOW}$) or a high reference signal ($V_{HIGH}$) to restore the original data encoded as a clock signal and transmitted. In other words, the memory device receiving a clock signal as a multilevel signal may restore the original data encoded as a clock signal and transmitted based on the clock signal and at least one of a low reference signal ($V_{LOW}$) or a high reference signal ($V_{HIGH}$). For example, when the clock signal is lower than the low reference signal $V_{LOW}$, data may be determined as 0, and when the clock signal is greater than the low reference signal $V_{LOW}$, data may be determined as 1. Similarly, when the clock signal is lower than the high reference signal $V_{HIGH}$, data may be determined as 0, and when the clock signal is greater than the high reference signal $V_{HIGH}$, data may be determined as 1.

The memory device receiving a clock signal as a multilevel signal may include a first sense amplifier for comparing the clock signal with a low reference signal $V_{LOW}$, and a second sense amplifier for comparing the clock signal with a high reference signal $V_{HIGH}$. The output of the first sense amplifier and the output of the second sense amplifier are input to the decoder, and the decoder may generate original data using the output of the first sense amplifier and the output of the second sense amplifier.

Different original data may be restored by comparing the clock signal with the low reference signal $V_{LOW}$ and the high reference signal $V_{HIGH}$, respectively. Accordingly, the memory device that encodes and transmits a clock signal may encode two different types of original data into one clock signal and transmit the encoded data to another memory device.

Figure 4:
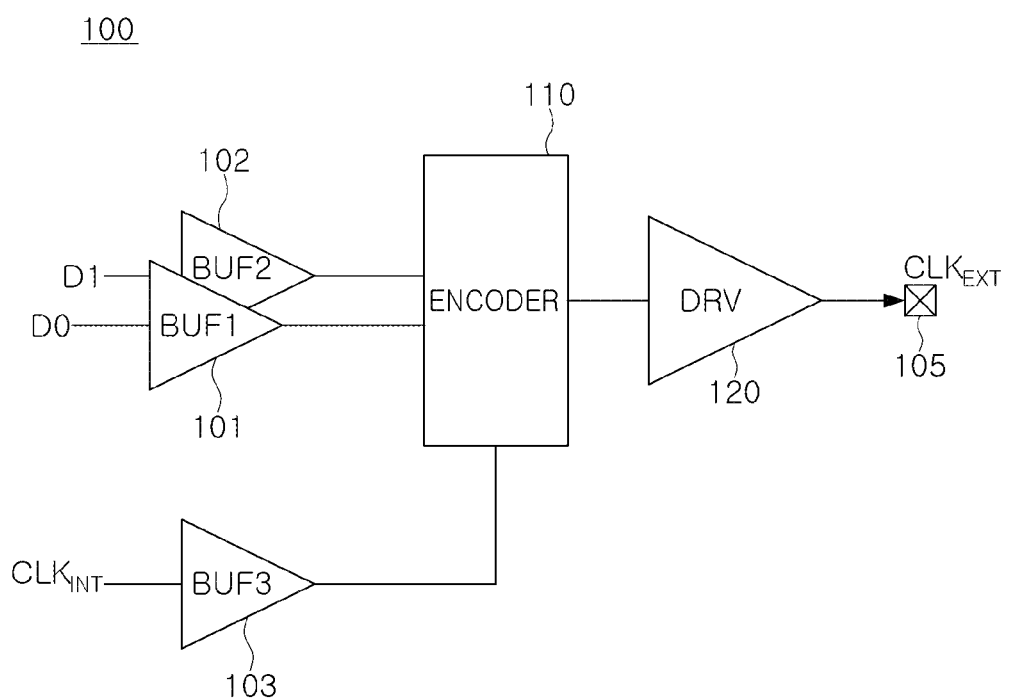
FIGS. 4 and 5 are diagrams schematically illustrating a semiconductor device according to an example embodiment.
Figure 5:
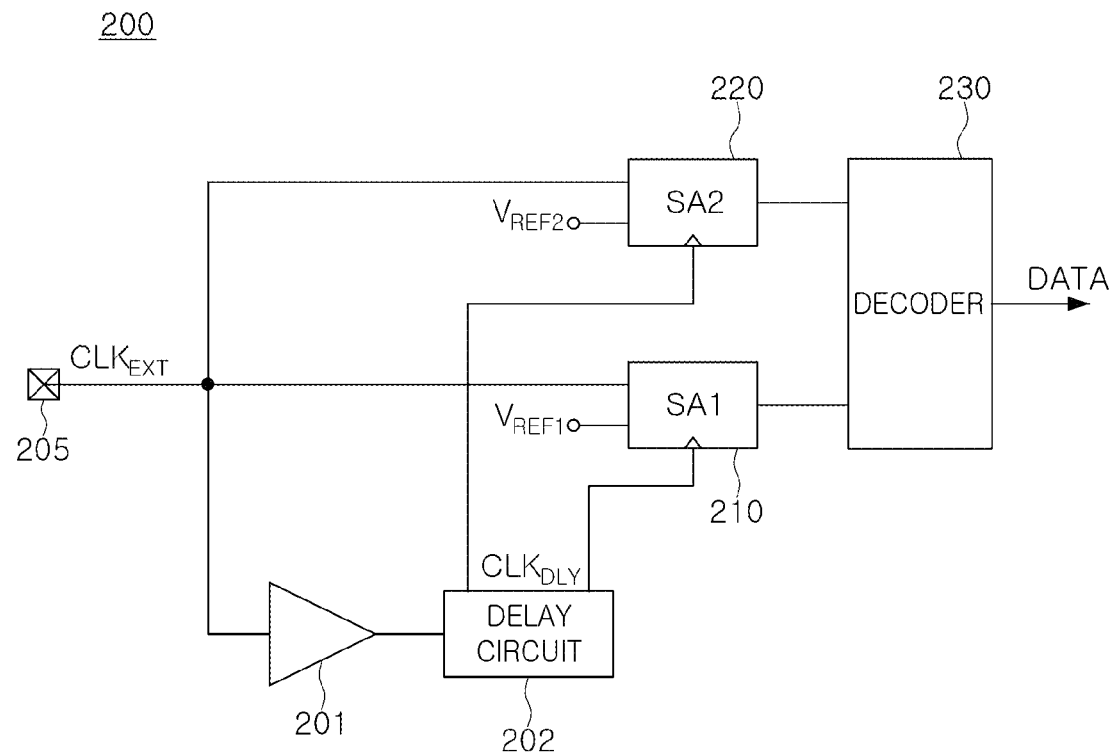

FIGS. 4 and 5 are diagrams schematically illustrating a semiconductor device according to an example embodiment.

First, FIG. 4 may be a simplified diagram illustrating a transmission-side semiconductor device 100 that generates a clock signal as a multilevel signal, encodes desired (or alternatively, predetermined) data into an external clock signal $CLK_{EXT}$, and outputs the encoded data to another memory device. For example, the semiconductor device 100 may be a device including a memory controller, such as a central processing unit, an AP, a solid state drive (SSD) controller, or a system-on-chip. Referring to FIG. 4, the semiconductor device 100 may include first to third buffers 101-103, an encoder 110, a driver 120, and the like. The external clock signal $CLK_{EXT}$ may be output to another semiconductor device through a clock transmission pin 105.

The first buffer 101 and the second buffer 102 may buffer the first data D0 and the second data D1 and input the buffered data to the encoder 110. The first data D0 and the second data D1 may be different data, and may be data that may be transmitted by being encoded into an external clock signal $CLK_{EXT}$ generated as a multilevel signal. The third buffer 103 may buffer an internal clock $CLK_{INT}$ of the semiconductor device 100 and transmit the buffered clock to the encoder 110.

The encoder 110 operates in synchronization with the internal clock $CLK_{INT}$, and may generate the external clock signal $CLK_{EXT}$ capable of transmitting at least one of the first data D0 or the second data D1. The external clock signal $CLK_{EXT}$ may be a clock signal transmitted to another memory device, and may be a multilevel signal generated by a pulse amplitude modulation method and having four different levels.

When only the first data D0 is encoded, the external clock signal $CLK_{EXT}$ may be generated to have a level lower than the low reference signal when the first data D0 is 0, and may be generated to have a level greater than the low reference signal when the first data D0 is 1. The external clock signal $CLK_{EXT}$ may be transmitted as a clock signal to another memory device, and may be a multilevel signal that swings with respect to the intermediate reference signal for each transition period.

Depending on some example embodiments, both the first data D0 and the second data D1 may be encoded with one external clock signal $CLK_{EXT}$. For example, when the first data D0 and the second data D1 are both 0, the external clock signal $CLK_{EXT}$ may be generated to have a level lower than a low reference signal, and when the first data D0 and the second data D1 are both 1, the external clock signal $CLK_{EXT}$ may be generated to have a level greater than a high reference signal. Further, when the first data D0 is 0 and the second data D1 is 1, the external clock signal $CLK_{EXT}$ may be generated to have a level lower than a high reference signal and a level higher than a low reference signal. As described above, the external clock signal $CLK_{EXT}$ may be generated as a multilevel signal swinging based on the intermediate reference signal for each transition period.

FIG. 5 may be a simplified diagram illustrating a receiving-side memory device 200 that receives an external clock signal $CLK_{EXT}$ generated as a multilevel signal and restores data by decoding the external clock signal $CLK_{EXT}$. The memory device 200 may receive the external clock signal $CLK_{EXT}$ through a clock receiving pin 205.

The external clock signal $CLK_{EXT}$ may be input to a delay circuit 202 through a clock buffer 201. Also, the external clock signal $CLK_{EXT}$ may be input to the first sense amplifier 210 and the second sense amplifier 220, respectively. The first sense amplifier 210 may compare the external clock signal $CLK_{EXT}$ with a first reference signal $V_{REF1}$, and the second sense amplifier 220 may compare the external clock signal $CLK_{EXT}$ with a second reference signal $V_{REF2}$. The first reference signal $V_{REF1}$ may be lower than the second reference signal $V_{REF2}$.

The delay circuit 202 may adjust the phase of the external clock signal $CLK_{EXT}$ and input the phase-adjusted signal to the first sense amplifier 210 and the second sense amplifier 220. In an example embodiment, the delay circuit 202 may generate a delayed clock signal $CLK_{DLY}$ by delaying the phase of the external clock signal $CLK_{EXT}$ by 90 degrees.

The first sense amplifier 210 and the second sense amplifier 220 may operate in synchronization with the delayed clock signal $CLK_{DLY}$.

For example, the external clock signals $CLK_{EXT}$ input to the first sense amplifier 210 and the second sense amplifier 220, respectively, may have different phases, due to the difference between a first transmission path from the clock reception pin 205 to the first sense amplifier 210 and a second transmission path from the clock reception pin 205 to the second sense amplifier 220, or the like. The delay circuit 202 may individually adjust the phases of the delayed clock signal $CLK_{DLY}$ input to the first sense amplifier 210 and the second sense amplifier 220, thereby optimizing operation timing of the first sense amplifier 210 and the second sense amplifier 220.

The decoder 230 may generate data (DATA) using a first output signal of the first sense amplifier 210 and a second output signal of the second sense amplifier 220. Each of the first output signal and the second output signal may be a non-return zero (NRZ) signal. As an example, the data may include at least one of first output data generated from the first output or and second output data generated from the second output signal. In an example embodiment, the first output data may correspond to the first data D0 described above with reference to FIG. 4, and the second output data may correspond to the second data D1.

In an example embodiment, the first output signal has a first logic value when the external clock signal $CLK_{EXT}$ is lower than the first reference signal $V_{REF1}$, and when the external clock signal $CLK_{EXT}$ is greater than the first reference signal $V_{REF1}$, the external clock signal $CLK_{EXT}$ may have a second logic value. Similarly, when the external clock signal $CLK_{EXT}$ is lower than the second reference signal $V_{REF2}$, the second output signal has a first logic value, and when the external clock signal $CLK_{EXT}$ is greater than the second reference signal $V_{REF2}$, the second output signal may have a second logic value. The decoder may decode the first data D0 and the second data D1 by converting the first logic value of each of the first and second output signals to 0 and a second logic value thereof to 1.

Figure 6:
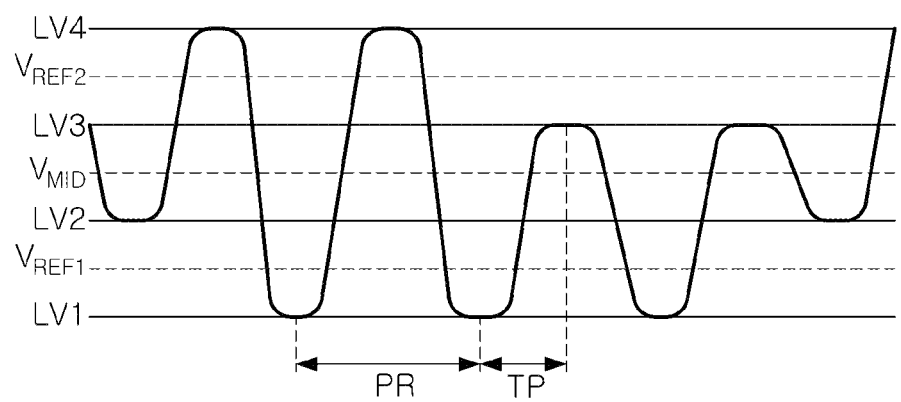
FIGS. 6 and 7 are diagrams provided to illustrate the operation of a memory device according to an example embodiment.
Figure 7:
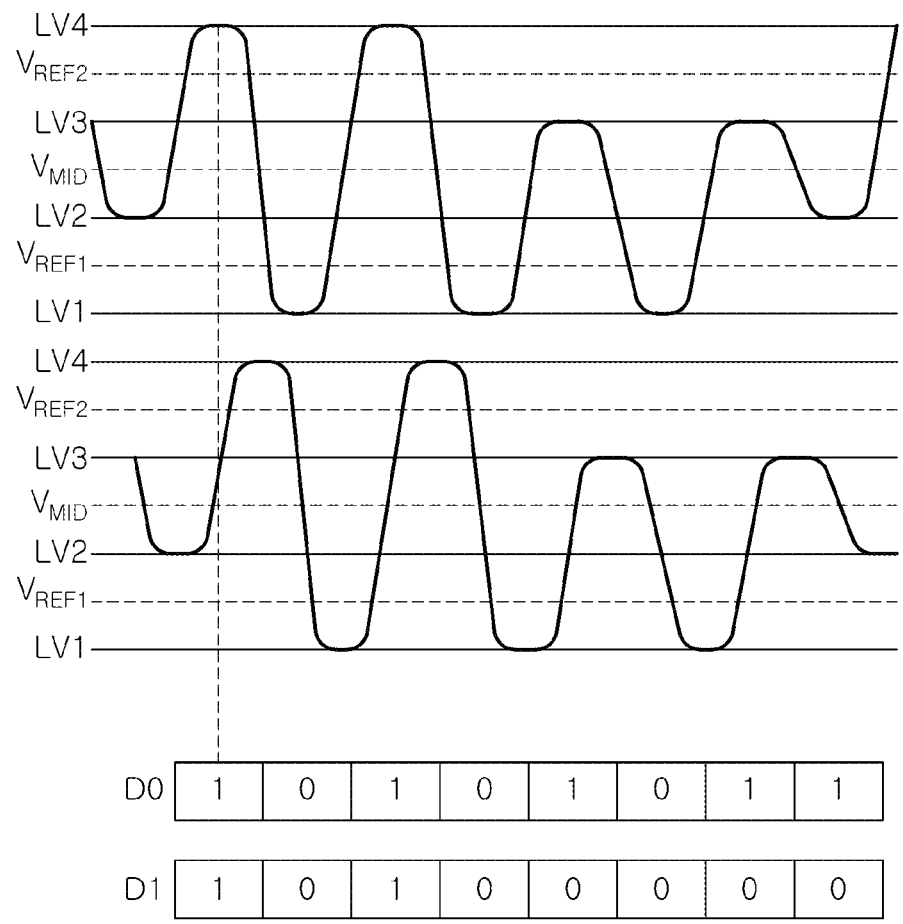

FIGS. 6 and 7 are diagrams provided to illustrate the operation of a memory device according to an example embodiment.

First, FIG. 6 may be a diagram illustrating a clock signal received by a memory device according to an example embodiment. The clock signal received by the memory device according to an example embodiment may be a multilevel signal generated by a pulse amplitude modulation method, and may have first to fourth levels LV1 to LV4.

The clock signal may be encoded based on desired (or alternatively, predetermined) data in a transmission-side semiconductor device that generates the clock signal. For example, when the data is 0, the clock signal has a level lower than the first reference signal $V_{REF1}$ or the second reference signal $V_{REF2}$, and when the data is 1, the clock signal may be generated to have a level higher than the first reference signal $V_{REF1}$ or the second reference signal $V_{REF2}$. Further, the clock signal may swing based on the intermediate reference signal $V_{MID}$ in the transition period TP, such that the receiving-side memory device may generate an internal clock signal desired for operation based on the clock signal.

FIG. 7 is a diagram for describing a method of decoding data encoded into a clock signal by a memory device receiving a clock signal. Referring to FIG. 7, the memory device may generate a delayed clock signal by phase shifting the clock signal by 90 degrees. Further, data may be generated based on the clock signal and an intermediate reference signal (e.g., at least one of the first reference signal $V_{REF1}$ or the second reference signal $V_{REF2}$), at the rising edge and the falling edge of the delayed clock signal. For example, data may be generated by comparing the clock signal with at least one of the first reference signal $V_{REF1}$ or the second reference signal $V_{REF2}$, at the rising edge and the falling edge of the delayed clock signal.

In the example embodiment illustrated in FIG. 7, the first data D0 may be data generated by comparing the clock signal with the first reference signal $V_{REF1}$ at each rising edge and each falling edge of the delayed clock signal. Referring to FIG. 7, in the first data transmission period PR, the clock signal is greater than the first reference signal $V_{REF1}$, and the first data D0 may be restored to 1. In the second transmission period PR, since the clock signal is lower than the first reference signal $V_{REF1}$, the first data D0 may be restored to zero.

On the other hand, in the example embodiment illustrated in FIG. 7, the second data D1 may be data generated by comparing the clock signal with the second reference signal $V_{REF2}$ at each rising edge and each falling edge of the delayed clock signal. Referring to FIG. 7, in the first data transmission period PR, a clock signal is greater than a second reference signal $V_{REF2}$, and the second data D1 may be restored to 1. In the second transmission period PR, since the clock signal is lower than the second reference signal $V_{REF2}$, the second data D1 may be restored to zero. Because the first data D0 and the second data D1 are simultaneously generated by 1 bit, the memory device may generate 2 bits of data for each data transmission period PR of the clock signal received as a multilevel signal.

As described with reference to FIG. 7, the memory device receiving a clock signal generated as a multilevel signal may decode data from the clock signal using a delayed clock signal generated by delaying the clock signal. Thus, through one clock signal generated as a multilevel signal, data as well as a clock signal desired for operation may be received. Accordingly, the number of transmitters and receivers as well as the number of pins desired for one memory device to communicate with another memory device may be reduced, integration of the memory device may be improved, and power consumption of the memory device may be reduced.

Figure 8A:
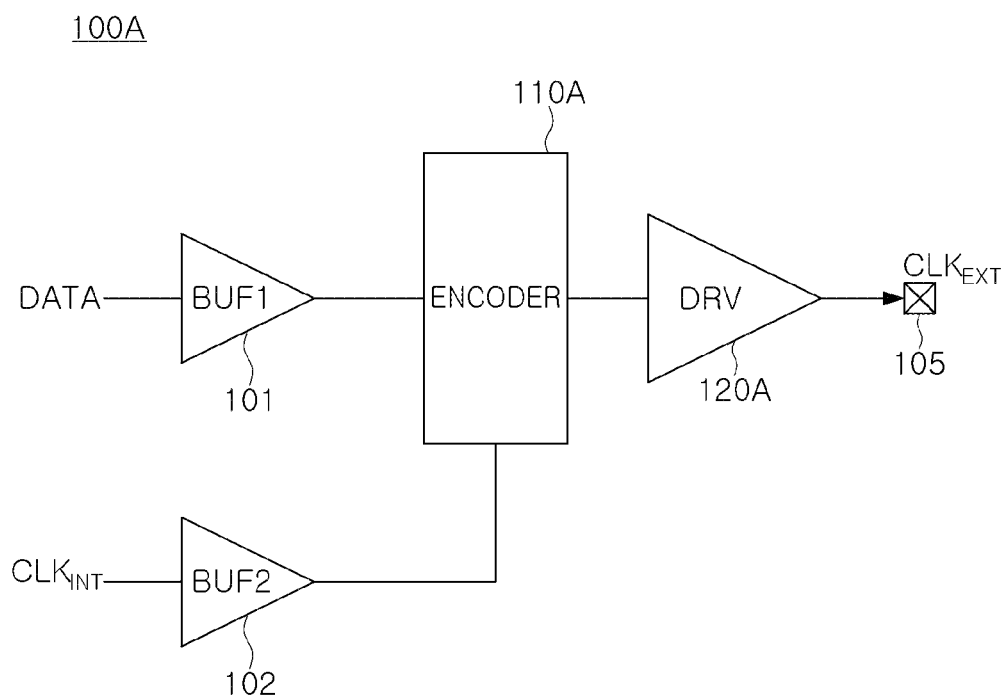
FIGS. 8A, 8B, and 9 are schematic diagrams illustrating a memory device according to an example embodiment.
Figure 8B:
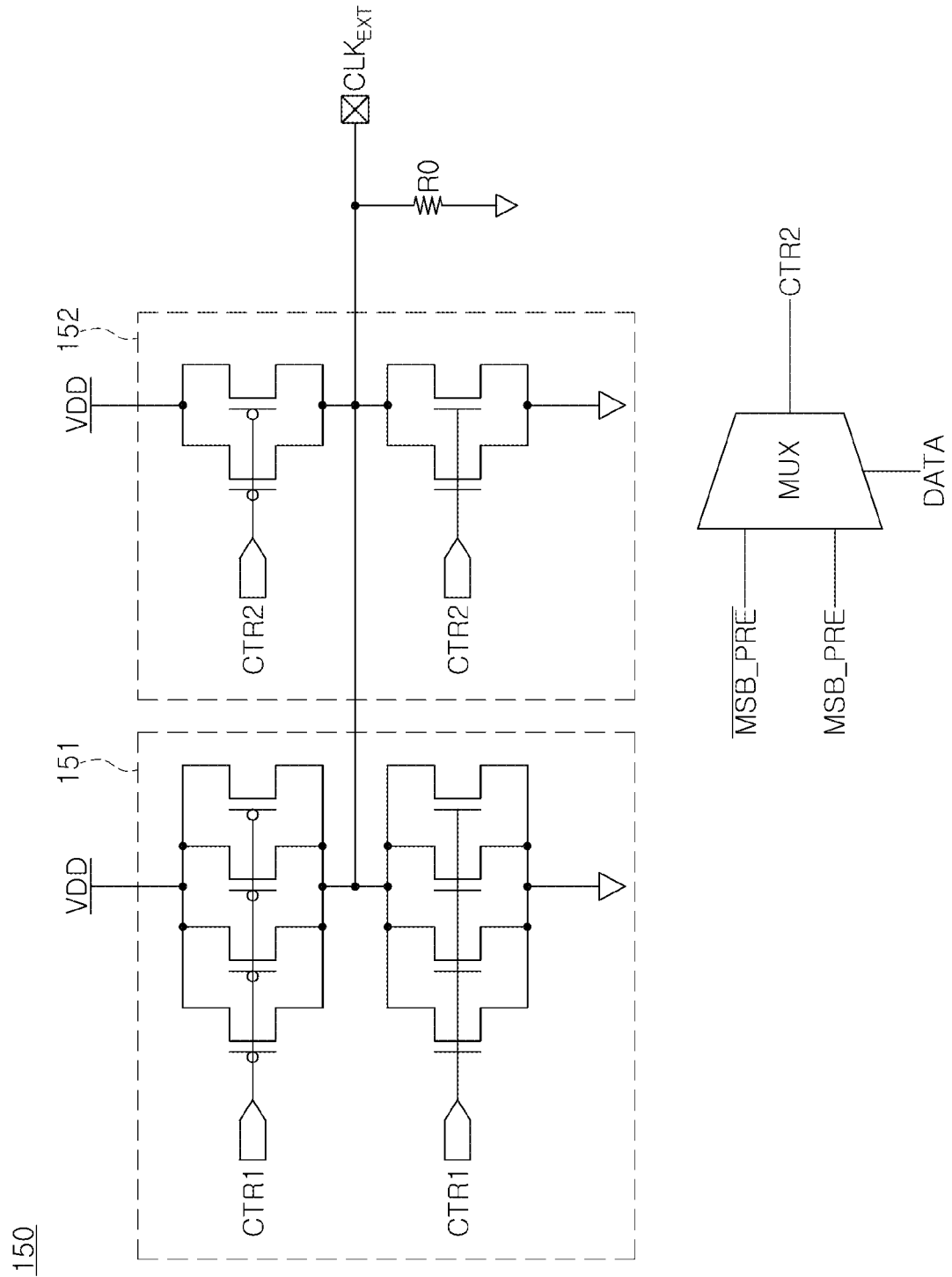
Figure 9:
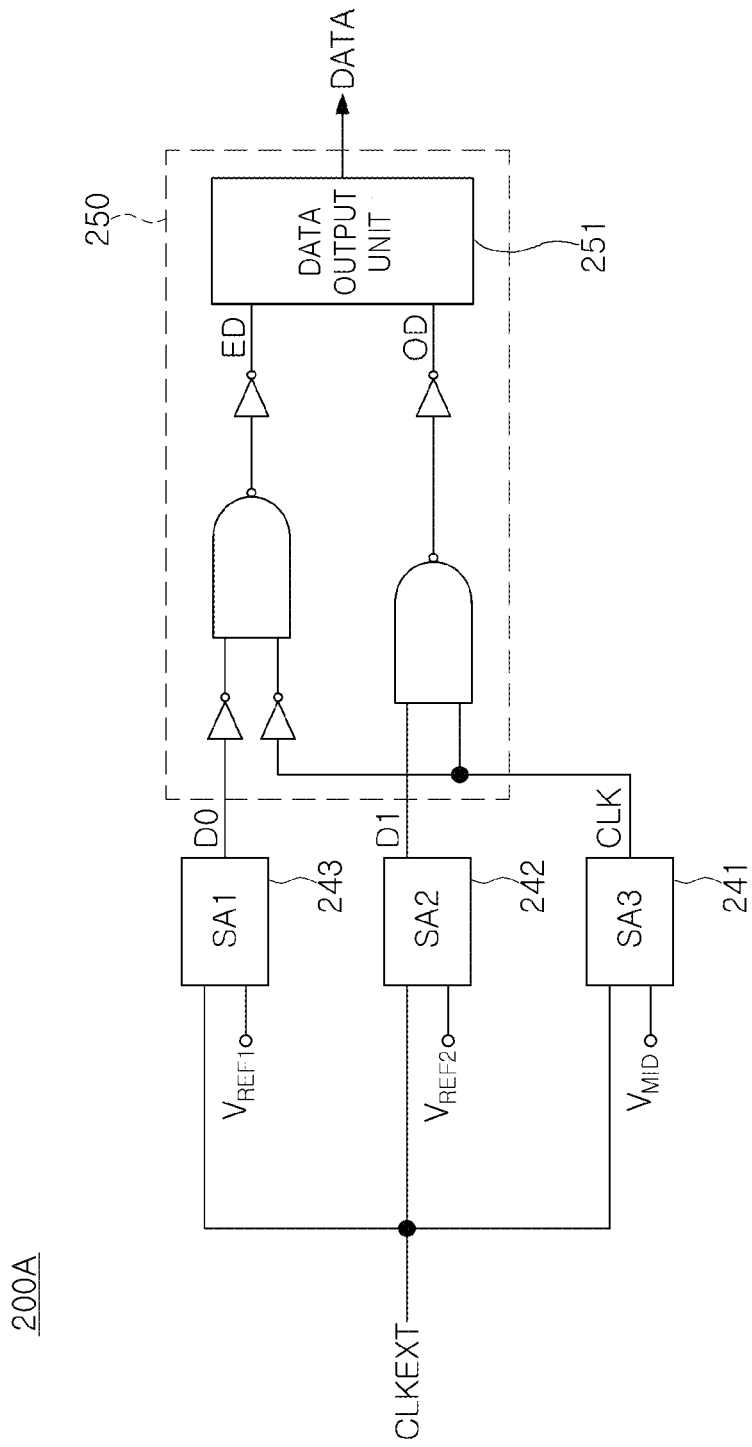

FIGS. 8A, 8B, and 9 are schematic diagrams illustrating a memory device according to an example embodiment.

First, FIG. 8A may be a simplified diagram illustrating a transmission-side semiconductor device 100A that encodes desired (or alternatively, predetermined) data with a clock signal generated as a multilevel signal and transmits the encoded data. The semiconductor device 100A according to the example embodiment illustrated in FIG. 8A may include a memory controller that controls the memory device. Referring to FIG. 8A, the semiconductor device 100A may include a first buffer 101 and a second buffer 102, an encoder 110A, and a driver 120A. The external clock signal $CLK_{EXT}$ may be output to another memory device through the clock transmission pin 105.

In the example embodiment illustrated in FIG. 8A, the semiconductor device 100A may encode data, which is transmitted by 1 bit per one data transmission period, into an external clock signal $CLK_{EXT}$ and output the encoded data to another memory device. The semiconductor device 100A may include a circuit for encoding data into an external clock signal $CLK_{EXT}$. Hereinafter, this example embodiment will be described in more detail with reference to FIG. 8B.

FIG. 8B may be a simplified diagram illustrating a transmitter 150 included in the transmission-side semiconductor device 100A. Referring to FIG. 8B, the transmitter 150 may include a first driver 151 and a second driver 152, and a multiplexer (MUX). Similar to the foregoing embodiment, the external clock signal $CLK_{EXT}$ generated by the transmitter 150 may be a multilevel signal having M levels (where M is a natural number greater than 2), and may swing based on (or with respect to) an intermediate level corresponding to a middle value of a minimum level and a maximum level among the M levels.

The first driver 151 may control the external clock signal $CLK_{EXT}$ to swing based on an intermediate level. For example, a first control signal CTR1 input to the first driver 151 may be changed to a high logic value or a low logic value for each period of the external clock signal $CLK_{EXT}$ to be generated. For example, when the first control signal CTR1 is a low logic value, the PMOS transistors of the first driver 151 may be turned on, and when the first control signal CTR1 is a high logic value, the NMOS transistors may be turned on. The first control signal CTR1 may be changed to a high logic value or a low logic value for each period so that the external clock signal $CLK_{EXT}$ swings based on the intermediate level.

In an example embodiment, the first control signal CTR1 may be determined by an upper bit MSB_PRE of the external clock signal $CLK_{EXT}$ in a previous period. For example, the first control signal CTR1 may be generated by latching the upper bit MSB_PRE of the external clock signal $CLK_{EXT}$ in the previous period.

The second driver 152 may operate according to the data to be transmitted by encoding the external clock signal $CLK_{EXT}$. For example, the second control signal CTR2 determining the operation of the second driver 152 may be determined by the data to be transmitted by encoding the external clock signal $CLK_{EXT}$. In an example embodiment, when the data is 0, the second control signal CTR2 may have a complementary value of the upper bit MSB_PRE of the external clock signal $CLK_{EXT}$ in the previous period. On the other hand, when the data is 1, the second control signal CTR2 may have the same value as the upper bit MSB_PRE of the external clock signal $CLK_{EXT}$ in the previous period.

For example, when the external clock signal $CLK_{EXT}$ has a level corresponding to [00] in the first period, the NMOS transistors of the first driver 151 and the second driver 152 may be turned on in the first period. In a second period following the first period, the NMOS transistors may be turned off and the PMOS transistors may be turned on in the first driver 151. On the other hand, when the data to be transmitted to the external clock signal $CLK_{EXT}$ is 1, the second control signal CTR2 is selected as 0, which is the previous high-order bit MSB_PRE, and the PMOS transistors of the second driver 152 in the second period are turned on, and the external clock signal $CLK_{EXT}$ may have a level corresponding to [11]. On the other hand, when the data is 0, the second control signal CTR2 may be selected as 1, which is a complementary value of the previous high-order bit MSB_PRE, and the NMOS transistors of the second driver 152 may be turned on in the second period. Accordingly, in the second period, the external clock signal $CLK_{EXT}$ may have a level corresponding to [10].

Similarly, when the external clock signal $CLK_{EXT}$ has a level corresponding to [10] in the first period and the data is 1, the second control signal CTR2 in the second period may be selected as 1, the previous high-order bit MSB_PRE. Accordingly, during the second period, the NMOS transistor is turned on in the second driver 152, and the external clock signal $CLK_{EXT}$ may have a level corresponding to [00]. On the other hand, when the data is 0, in the second period, the second control signal CTR2 is determined to be 0, which is a complementary value of the previous upper bit MSB_PRE, and the PMOS transistors are turned on in the second driver 152, and thus, the external clock signal $CLK_{EXT}$ may have a level corresponding to [01].

Next, referring to FIG. 9, the receiving-side memory device 200A may include sense amplifiers 241-243 comparing an external clock signal $CLK_{EXT}$ with a reference signal, a decoder 250 for restoring data, and the like. Hereinafter, operations of the transmission side semiconductor device 100A and the receiving-side memory device 200A will be described with reference to FIGS. 10A and 10B together.

Figure 10A:
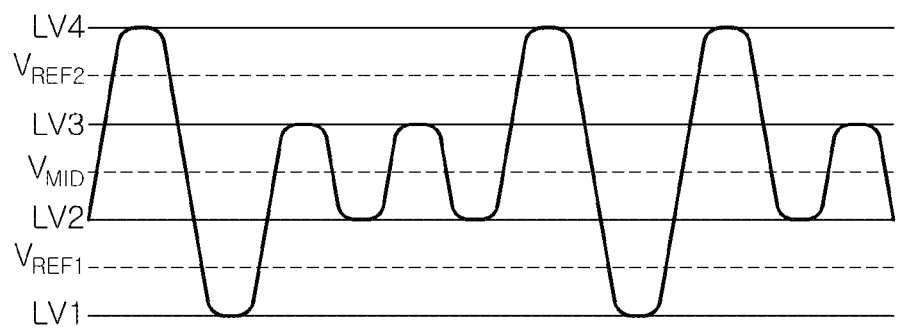
FIGS. 10A and 10B are diagrams provided to illustrate an operation of a memory device according to an example embodiment.
Figure 10B:
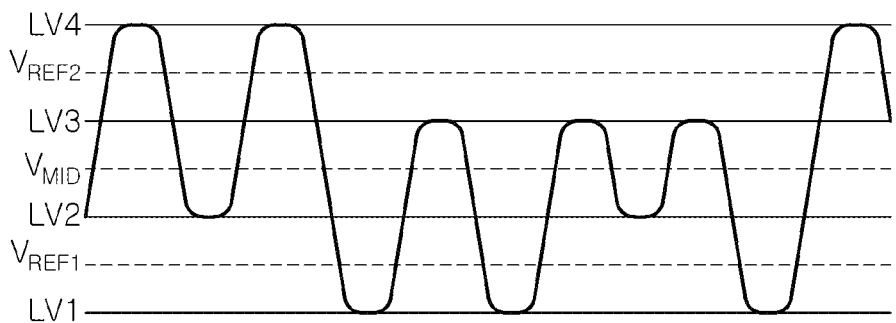

FIGS. 10A and 10B are diagrams provided to illustrate the operation of a memory device according to an example embodiment.

FIGS. 10A and 10B are diagrams illustrating an external clock signal $CLK_{EXT}$ received by the memory device 200A. The external clock signal $CLK_{EXT}$ may be a multilevel signal having first to fourth levels LV1 to LV4 and may swing based on the intermediate reference signal $V_{MID}$.

As described above, the external clock signal $CLK_{EXT}$ may be determined according to the data to be transmitted. The second driver 152 of the transmission-side semiconductor device 100A may operate by a second control signal CTR2 determined according to the data. For example, when the data is 0, the lower bit of the external clock signal $CLK_{EXT}$ may be input to the second driver 152 as the second control signal CTR2 as is. Accordingly, the external clock signal $CLK_{EXT}$ may have the second level LV2 or the third level LV3. Conversely, when the data is 1, the lower bit of the external clock signal $CLK_{EXT}$ is inverted by the multiplexer MUX, and may be input to the second driver 152 as the second control signal CTR2. Accordingly, the external clock signal $CLK_{EXT}$ may have the first level LV1 or the fourth level LV4.

In the example embodiment illustrated in FIG. 10A, the data transmitted through the external clock signal $CLK_{EXT}$ may be [11000011100]. On the other hand, in the example embodiment illustrated in FIG. 10B, the data transmitted as the external clock signal $CLK_{EXT}$ may be [10110100011]. Hereinafter, the operation of the receiving-side memory device 200A will be described with reference to FIGS. 10A and 10B together with FIG. 9. First, data transmitted as the external clock signal $CLK_{EXT}$ according to the example embodiment illustrated in FIG. 10A and an operation of the receiving-side memory device 200A according thereto may be described with reference to Table 1 below.

TABLE 1

| $CLK_{EXT}$ | 11 | 00 | 10 | 01 | 10 | 01 | 11 | 00 | 11 | 01 | 10 |
|---|---|---|---|---|---|---|---|---|---|---|---|
| DATA | 1 | 1 | 0 | 0 | 0 | 0 | 1 | 1 | 1 | 0 | 0 |
| CLK | 1 | 0 | 1 | 0 | 1 | 0 | 1 | 0 | 1 | 0 | 1 |
| D0 | 1 | 0 | 1 | 1 | 1 | 1 | 1 | 0 | 1 | 1 | 1 |
| D1 | 1 | 0 | 0 | 0 | 0 | 0 | 1 | 0 | 1 | 0 | 0 |
| ED | 0 | 1 | 0 | 0 | 0 | 0 | 0 | 1 | 0 | 0 | 0 |
| OD | 1 | 0 | 0 | 0 | 0 | 0 | 1 | 0 | 1 | 0 | 0 |

Referring to FIG. 9, the memory device 200A may generate a clock signal CLK based on an external clock signal $CLK_{EXT}$ with an intermediate reference signal $V_{MID}$ (e.g., by comparing the external clock signal $CLK_{EXT}$ with the intermediate reference signal $V_{MID}$). Further, the memory device 200A may generate first data D0 by comparing the external clock signal $CLK_{EXT}$ with the first reference signal $V_{REF1}$, and may generate the second data D1 by comparing the external clock signal $CLK_{EXT}$ with the second reference signal $V_{REF2}$.

In an example embodiment, the first data D0 and the second data D1 may be used to generate odd-numbered data OD and even-numbered data ED, respectively. For example, the odd-numbered data OD may be data generated by inputting the second data D1 and the clock signal CLK to the NAND gate and inverting the output of the NAND gate. The even-numbered data ED may be data generated by respectively inverting the first data D0 and the clock signal CLK to be input to the NAND gate and inverting the output of the NAND gate. The decoder 250 may include a data output unit 251. The data output unit 251 may alternately output odd-numbered data OD and even-numbered data ED to generate data encoded with the external clock signal $CLK_{EXT}$.

Next, data transmitted as the external clock signal $CLK_{EXT}$ according to the example embodiment illustrated in FIG. 10B and an operation of the receiving-side memory device 200A according thereto may be as illustrated in Table 2 below. The operation of the memory device 200A may be understood similarly to that described with reference to Table 1 above.

TABLE 2

| $CLK_{EXT}$ | 11 | 01 | 11 | 00 | 10 | 00 | 10 | 01 | 10 | 00 | 11 |
|---|---|---|---|---|---|---|---|---|---|---|---|
| DATA | 1 | 0 | 1 | 1 | 0 | 1 | 0 | 0 | 0 | 1 | 1 |
| CLK | 1 | 0 | 1 | 0 | 1 | 0 | 1 | 0 | 1 | 0 | 1 |
| D0 | 1 | 1 | 1 | 0 | 1 | 0 | 1 | 1 | 1 | 0 | 1 |
| D1 | 1 | 0 | 1 | 0 | 0 | 0 | 0 | 0 | 0 | 0 | 1 |
| ED | 0 | 0 | 0 | 1 | 0 | 1 | 0 | 0 | 0 | 1 | 0 |
| OD | 1 | 0 | 1 | 0 | 0 | 0 | 0 | 0 | 0 | 0 | 1 |

Figure 11:
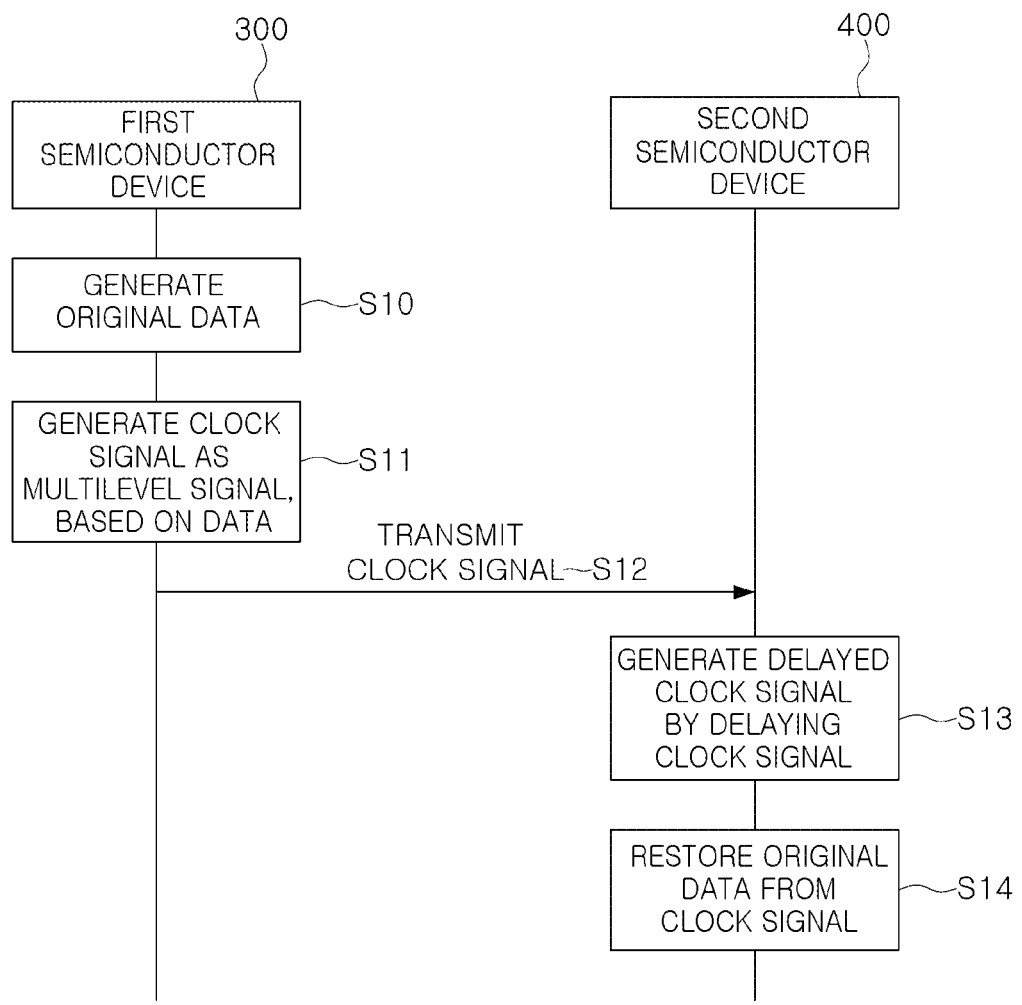
FIG. 11 is a diagram provided to illustrate an operation of a memory device according to example embodiments.

FIG. 11 is a diagram provided to illustrate an operation of a memory device according to example embodiments.

Referring to FIG. 11, a system according to an example embodiment may include a first semiconductor device 300 and a second semiconductor device 400. In an example embodiment described with reference to FIG. 11, the first semiconductor device 300 may generate and transmit a clock signal, and the second semiconductor device 400 may receive the clock signal. In an example embodiment, the first semiconductor device 300 may be a device including a memory controller, and the second semiconductor device 400 may be a memory device storing data in response to the control of the first semiconductor device 300.

The first semiconductor device 300 may generate original data to be transmitted by encoding the data into a clock signal (S10). When the original data is generated or selected, the first semiconductor device 300 may generate a clock signal as a multilevel signal based on the data (S11). As described above, the clock signal may be generated as a multilevel signal by a pulse amplitude modulation method. In this case, the multilevel signal may have at least four levels based on at least three reference signals, and the clock signal may swing based on an intermediate reference signal having an intermediate level among the reference signals. For example, for each transition period, the clock signal may increase or decrease based on the intermediate reference signal.

The first semiconductor device 300 may transmit a clock signal to the second semiconductor device 400 (S12). The second semiconductor device 400 may generate a delayed clock signal by delaying the clock signal (S13). For example, the second semiconductor device 400 generates a delayed clock signal by delaying the phase of the clock signal by 90 degrees, and the timing at which the second semiconductor device 400 compares the clock signal with the reference signal may be determined by the delayed clock signal.

The second semiconductor device 400 includes a multi-level receiver, and the multilevel receiver decodes a clock signal to restore original data (S14). The multilevel receiver includes a sense amplifier comparing a clock signal with a reference signal, and an operation timing of the sense amplifier may be determined by a delayed clock signal.

The multilevel receiver may restore data based on the multilevel signal (e.g., a clock signal) and the reference signal. For example, for each rising edge and each falling edge of the delayed clock signal, the sense amplifier of the multilevel receiver may compare the clock signal with the reference signal. The multilevel receiver may restore data to 1 when the clock signal is greater than the reference signal at the rising edge or the falling edge of the delayed clock signal, and may restore data to 0 when the clock signal is lower than the reference signal.

Figure 12:
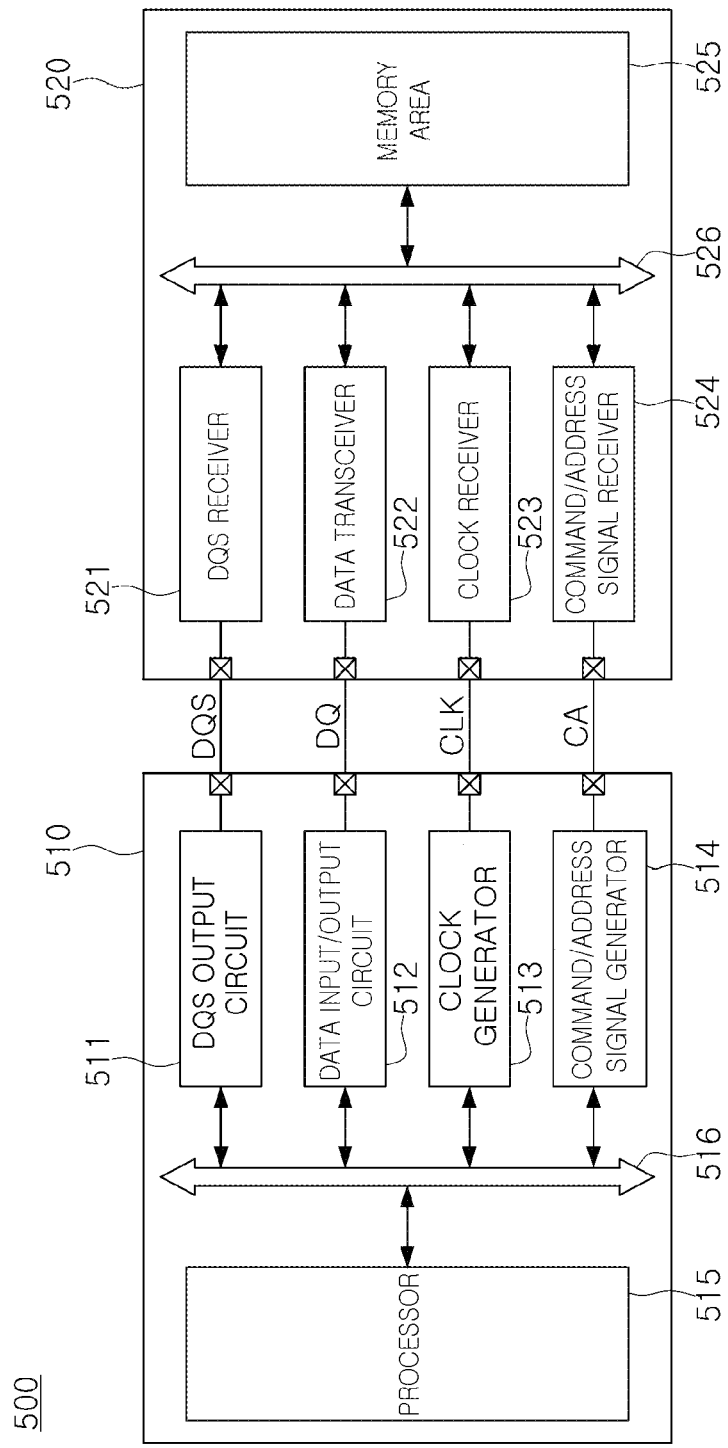
FIG. 12 is a schematic diagram of a memory system according to an example embodiment.

FIG. 12 is a schematic diagram of a memory system according to an example embodiment.

Referring to FIG. 12, a memory system 500 according to an example embodiment may include a controller 510 and a memory device 520. The controller 510 may include a DQS output circuit 511, a data input/output circuit 512, a clock generator 513, a command/address signal generator 514, a processor 515, and the like. Components 511-515 included in the controller 510 may exchange data with each other through a bus 516. On the other hand, the memory device 520 may include a DQS receiver 521, a data transceiver 522, a clock receiver 523, a command/address signal receiver 524, and a memory area 525. The components 521 to 525 included in the memory device 520 may exchange data with each other through a bus 526. The memory area 525 may include a bank having memory cells.

At least one of a data signal DQ, a data strobe signal DQS, a clock signal CLK, or a command/address signal CA transmitted between the controller 510 and the memory device 520 may be a multilevel signal. In an example embodiment, the controller 510 may encode desired (or alternatively, predetermined) data into at least one of the clock signal CLK or the data strobe signal DQS and may transmit the encoded data to the memory device 520.

In an example embodiment, the controller 510 may encode desired (or alternatively, predetermined) original data into the data strobe signal DQS and may transmit the encoded data to the memory device 520. The DQS receiver 521 of the memory device 520 may restore the data strobe signal DQS received as a multilevel signal to an NRZ signal. Further, the DQS receiver 521 may compare the data strobe signal DQS received as a multilevel signal with at least one reference signal to restore original data encoded as the data strobe signal DQS.

For example, the controller 510 may encode at least one of data Bus Inversion (DBI) data, error Correction Code (ECC) data, cyclic Redundancy Check (CRC) data, data mask (DM) data, or command/address data, into a data strobe signal (DQS) and/or a clock signal (CLK), and may transmit the encoded data to the memory device 520. As an example, when the controller 510 encodes the command/address data into the data strobe signal DQS and/or the clock signal CLK and transmits the encoded data to the memory device 520, the command/address signal receiver 524 and the pin receiving the command/address signal may be omitted from the memory device 520. In addition, when DBI data is encoded into the data strobe signal DQS and/or the clock signal CLK and transmitted to the memory device 520, a pin for receiving DBI data may not be included in the memory device 520.

As described above, in an example embodiment, the controller 510 transmits the data by including desired (or alternatively, predetermined) data in the data strobe signal DQS and/or the clock signal CLK, and the memory device 520 may decode the data included in the data strobe signal DQS and/or the clock signal CLK. Accordingly, pins for the memory device 520 to receive the data as separate signals, as well as a receiver, may be omitted, and the integration degree of the memory device 520 may be improved and power consumption may be reduced.

In addition, the memory device 520 generates a delayed multilevel signal by delaying the data strobe signal DQS and/or the clock signal CLK including data, and may decode the data included in the data strobe signal DQS and/or the clock signal CLK, using the delayed multilevel signal. Accordingly, data encoded into the data strobe signal DQS and/or the clock signal CLK may be received without a separate signal for determining the operation timing.

Figure 13:
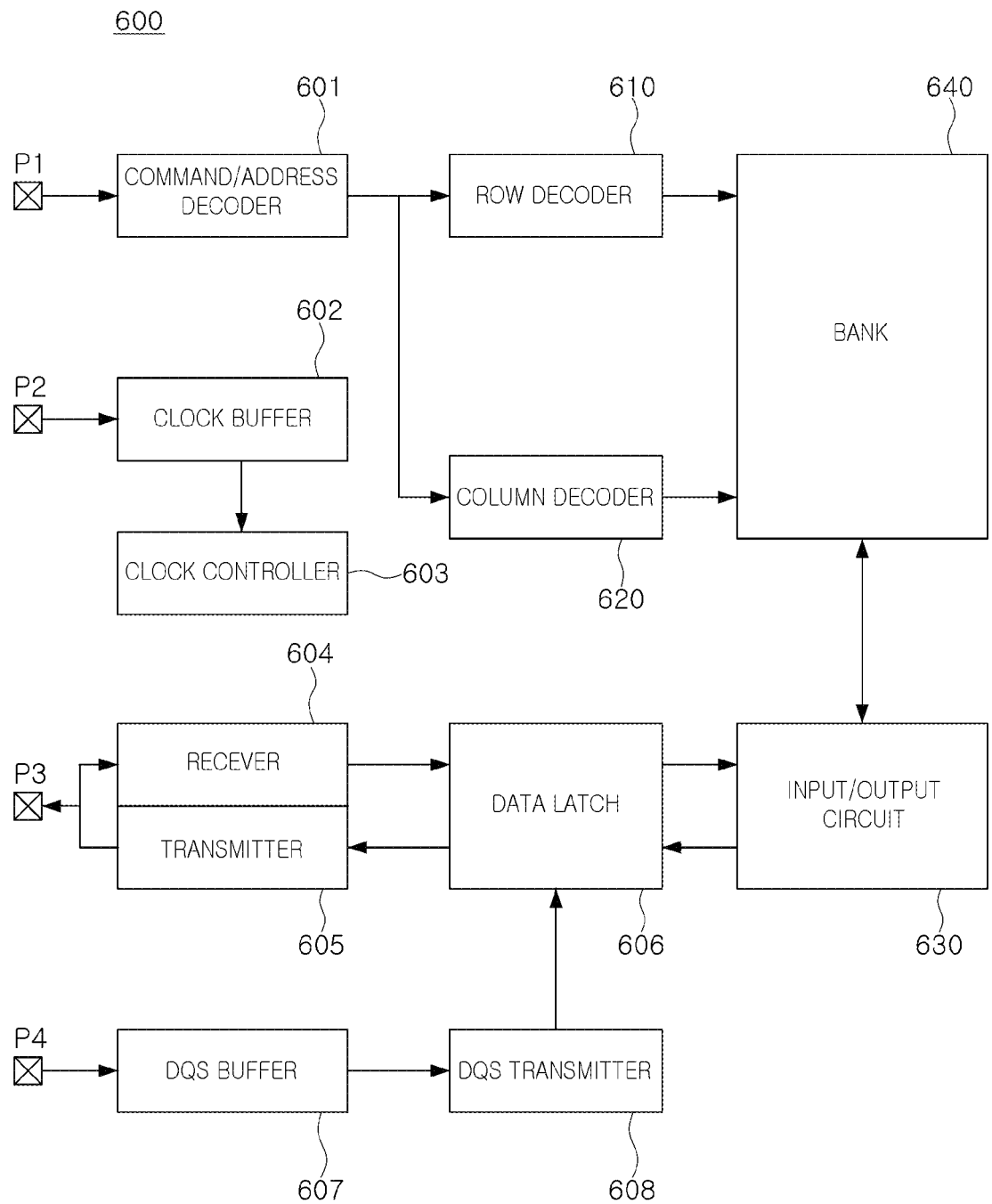
FIG. 13 is a schematic diagram of a memory device included in a memory system according to an example embodiment.

FIG. 13 is a schematic diagram of a memory device included in a memory system according to an example embodiment.

Referring to FIG. 13, a memory device 600 according to an example embodiment may include a command/address decoder 601, a clock buffer 602, a clock controller 603, a receiver 604, a transmitter 605, a data latch 606, a DQS buffer 607, a DQS transmitter 608, a row decoder 610, a column decoder 620, an input/output circuit 630, a bank 640, and the like. Components other than the bank may be included in the logic circuit of the memory device 600.

The row decoder 610 and the column decoder 620 may select at least one of the memory cells included in the bank 640, and the input/output circuit 630 may write data to the selected memory cells or may read data stored in the selected memory cells. The row decoder 610 and the column decoder 620 may determine selected memory cells according to a command/address signal received by the command/address decoder 601.

Also, the memory device 600 may include a plurality of circuits connected to pins P1 to P4. For example, the command/address decoder 601 may be connected to the command/address pin P1, and the clock buffer 602 and the clock controller 603 may be connected to the clock pin P2. The receiver 604 and the transmitter 605 may be connected to the data pin P3. The DQS buffer 607 may be connected to the DQS pin P4.

The receiver 604 and the transmitter 605 may be connected to the input/output circuit 630 through a data latch 606. The data latch 606 may store data received by the receiver 604 from an external semiconductor device and may transmit the stored data to the input/output circuit 630 or may transmit data stored in the input/output circuit 630 to the transmitter 605. The data latch 606 may operate in synchronization with a data strobe signal output from the DQS transmitter 608.

For example, at least one of a clock signal received through the clock pin P2 or a data strobe signal received through the DQS pin P4 may be a multilevel signal. For example, the data strobe signal may be a multilevel signal including at least one of DBI data, ECC data, CRC data, or DM data.

A multilevel receiver decoding data from a data strobe signal may be connected to the DQS pin P4. The multilevel receiver may restore data included in the data strobe signal by comparing the data strobe signal with at least one of the first reference signal or the second reference signal. The first reference signal and the second reference signal may be reference signals having a magnitude different from that of the intermediate reference signal among reference signals of the multilevel signal.

According to some example embodiments, a multilevel receiver may also be connected to the clock pin P2. The multilevel receiver connected to the clock pin P2 may compare the clock signal with at least one of a first clock reference signal or a second clock reference signal greater than the first clock reference signal to restore data encoded as a clock signal. The first clock reference signal and the second clock reference signal may have a level different from that of the first and second reference signals compared to the data strobe signal.

As an example, the operation of the multilevel receiver connected to the clock pin P2 may be understood with reference to the example embodiments described above with reference to FIGS. 5 to 7, and 9. The data encoded into the clock signal may be data different from the data encoded into the multilevel signal. For example, data encoded as a multilevel signal may be DBI data, and data encoded as a clock signal may be ECC data.

Figure 14:
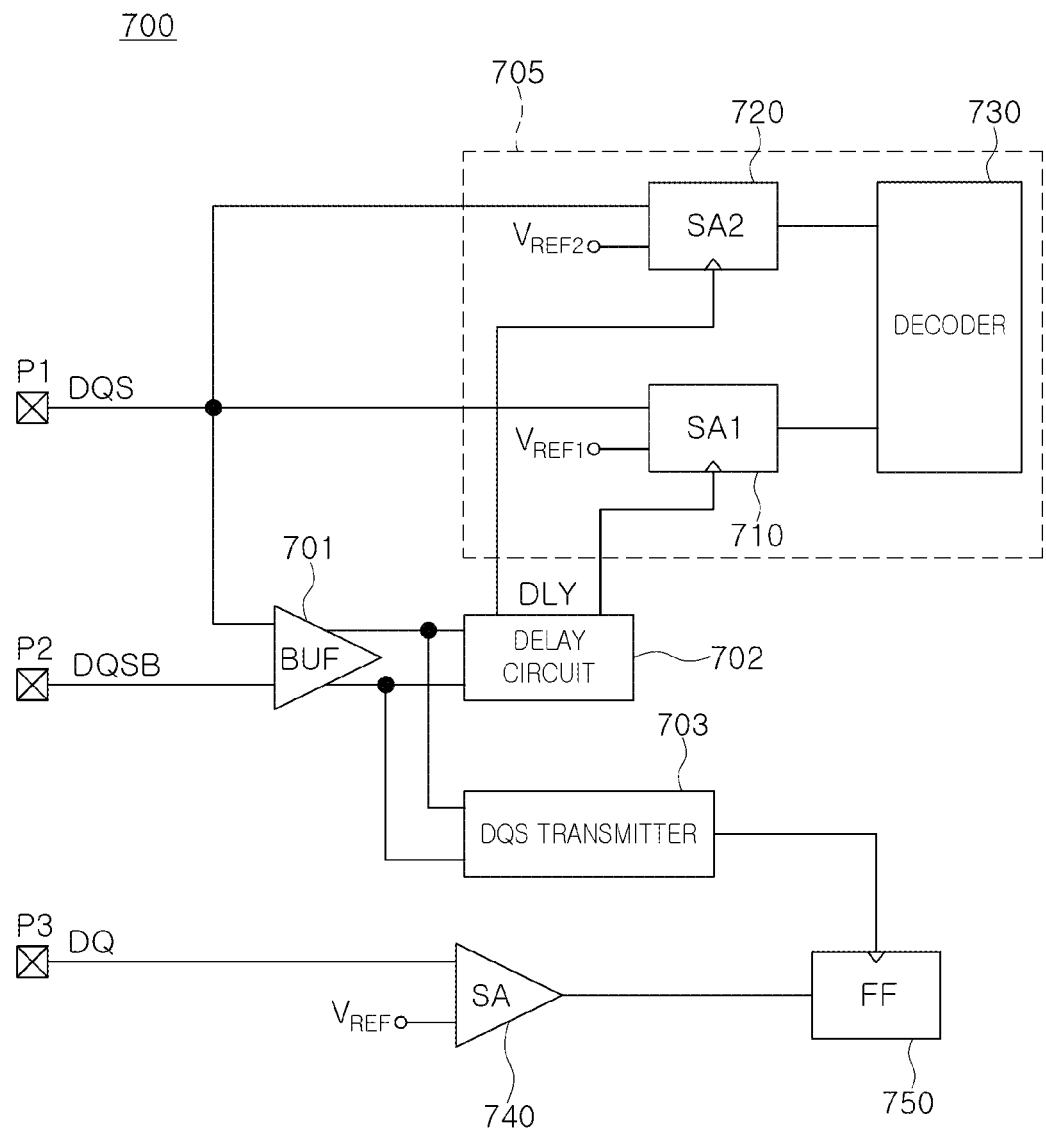
FIG. 14 is a schematic diagram of a memory device included in a memory system according to an example embodiment.

FIG. 14 is a schematic diagram of a memory device included in a memory system according to an example embodiment.

Referring to FIG. 14, a memory device 700 according to an example embodiment may receive a first multilevel signal corresponding to a data strobe signal DQS through a first pin P1, receive a second multilevel signal corresponding to the inverted data strobe signal DQSB through a second pin P2, and receive a data signal DQ through a third pin P3. For example, the data signal DQ is compared with the reference voltage $V_{REF}$ by the sense amplifier 740 and may be stored in a data latch 750. When the data signal DQ is a multilevel signal, the data signal DQ may be commonly input to a plurality of sense amplifiers. Different reference voltages may be input to the plurality of sense amplifiers.

The first multilevel signal and the second multilevel signal may be input to a delay circuit 702 and a DQS transmission circuit 703 through a buffer 701. Further, the first multilevel signal may be commonly input to the first sense amplifier 710 and the second sense amplifier 720 of the multilevel receiver 705. The first sense amplifier 710 may generate a first output signal by comparing the first multilevel signal with the first reference signal $V_{REF1}$, and the second sense amplifier 720 may generate a second output signal by comparing the second multilevel signal with a second reference signal $V_{REF2}$.

The data strobe signal DQS may be a multilevel signal having M levels (where M is a natural number greater than 2), and the multilevel receiver 705 may include N sense amplifiers (N is a natural number lower than M). In the example embodiment illustrated in FIG. 11, the data strobe signal may be a multilevel signal having four levels. When four levels of the multilevel signal are defined as a first level to a fourth level in order of magnitude, the first reference signal $V_{REF1}$ has an intermediate level between the first level and the second level, and the second reference signal $V_{REF2}$ may have an intermediate level between the third level and the fourth level.

The delay circuit 702 may generate a delayed multilevel signal DLY by delaying the first multilevel signal and/or the second multilevel signal. The first sense amplifier 710 and the second sense amplifier 720 may compare the first multilevel signal with the first reference signal $V_{REF1}$ and the second reference signal $V_{REF2}$, respectively, for each rising edge and each falling edge of the delayed multilevel signal DLY.

The first sense amplifier 710 may generate a first output signal by comparing the first multilevel signal with the first reference signal $V_{REF1}$, and the second sense amplifier 720 may generate a second output signal by comparing the second multilevel signal with the second reference signal $V_{REF2}$. The multilevel receiver 705 may further include a decoder 730 that generates data using at least one of a first output signal or a second output signal.

Hereinafter, the operation of the memory device 700 will be described in more detail with reference to FIG. 15 to 17 together.

Figure 15:
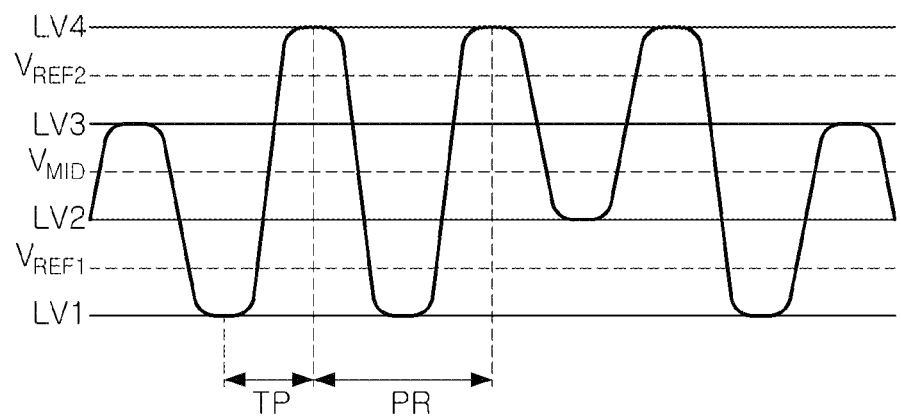
FIGS. 15 to 17 are diagrams provided to illustrate the operation of a memory device according to an example embodiment.
Figure 16:
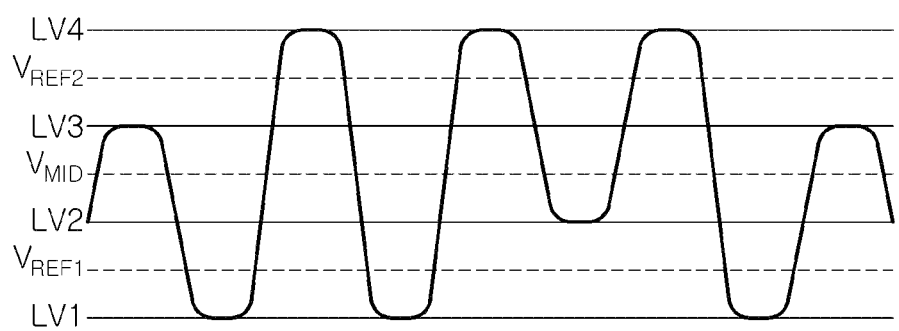
Figure 16:
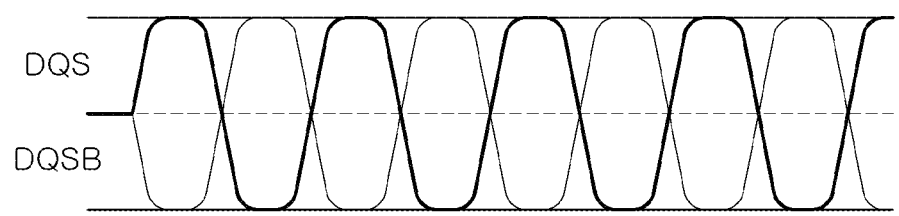
Figure 17:
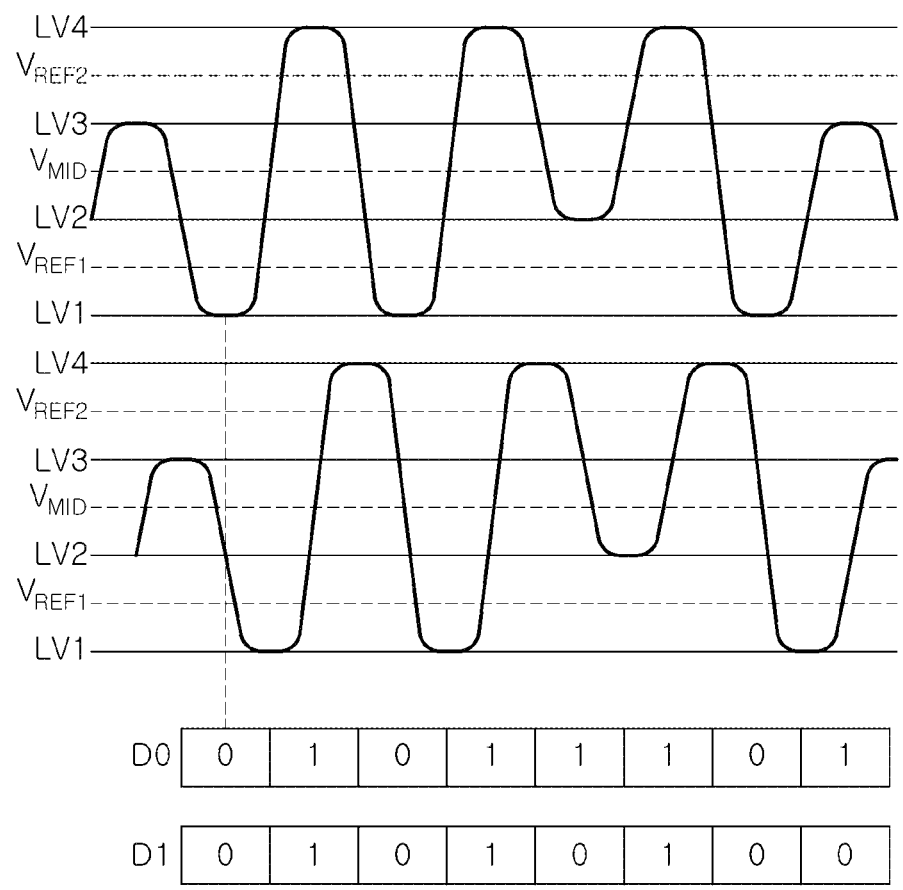

FIG. 15 to 17 are diagrams provided to illustrate the operation of a memory device according to an example embodiment.

FIG. 15 may be an example of a multilevel signal received by the memory device 700 through the DQS pin P1. Referring to FIG. 15, a multilevel signal may have first to fourth levels LV1 to LV4 and may swing based on an intermediate reference signal $V_{MID}$. For example, the multilevel signal may increase or decrease while passing through the intermediate reference signal $V_{MID}$ for each transition period TP.

The DQS transmission circuit 703 may restore the data strobe signal DQS and the inverted data strobe signal DQSB to an NRZ signal using a multilevel signal. Referring to FIG. 16, the data strobe signal DQS may be generated according to a comparison result of a multilevel signal and an intermediate reference signal $V_{MID}$. For example, when the multilevel signal is greater than the intermediate reference signal $V_{MID}$, the data strobe signal DQS has a high logic value, and when the multilevel signal is lower than the intermediate reference signal $V_{MID}$, the data strobe signal DQS may have a low logic value. The inverted data strobe signal DQSB may be an inverted signal of the data strobe signal DQS.

On the other hand, as described above, the multilevel receiver 705 may decode data included in the multilevel signal. The first sense amplifier 710 compares the data strobe signal DQS with the first reference signal $V_{REF1}$, and the second sense amplifier 720 may compare the data strobe signal DQS with the second reference signal $V_{REF2}$. The timing at which the first sense amplifier 710 and the second sense amplifier 720 compare the data strobe signal with the first reference signal $V_{REF1}$ and the second reference signal $V_{REF2}$ may be controlled by the delay signal DLY.

Referring to FIG. 17, for each rising edge and each falling edge of the delay signal DLY, the first sense amplifier 710 may compare the multilevel signal with the first reference signal $V_{REF1}$, and the second sense amplifier 720 may compare the multilevel signal with the second reference signal $V_{REF2}$. The first data D0 may be data generated by the decoder 730 from the first output signal of the first sense amplifier 710, and the second data D1 may be data generated by the decoder 730 from the second output signal of the second sense amplifier 720.

Referring to FIG. 17, in a first data transmission period PR, a multilevel signal may be lower than the first reference signal $V_{REF1}$, and a first data D0 may be generated as 0. Also, in a second transmission period PR, the multilevel signal may be greater than the first reference signal $V_{REF1}$, and the first data D0 may be generated as 1. Further, in the first data transmission period PR, the clock signal may be lower than the second reference signal $V_{REF2}$, and the second data D1 may be generated as 0. Further, in the second transmission period PR, the clock signal is greater than the second reference signal $V_{REF2}$, and the second data D1 may be generated as 1. Because the first data D0 and the second data D1 are simultaneously generated by 1 bit, the memory device 700 may generate 2 bits of data for each data transmission period PR of the multilevel signal.

As described above, the multilevel signal may be a signal received by the memory device 700 through the DQS pin P1. The first data D0 and/or the second data D1 generated from the multilevel signal may include at least one of DBI data, CRC data, ECC data, DB data, or command/address data. Therefore, the memory device 700 may not include a separate pin and receiver for receiving the first data D0 and/or the second data D1, and the density and power consumption of the memory device 700 may be improved.

According to example embodiments, the memory device 700 may restore original data encoded by an external semiconductor device into a multilevel signal using the first data D0 and the second data D1. For example, one original data may be generated using the first data D0 and the second data D1. In some example embodiments, one of the first data D0 or the second data D1 may be processed as dummy data.

Figure 18:
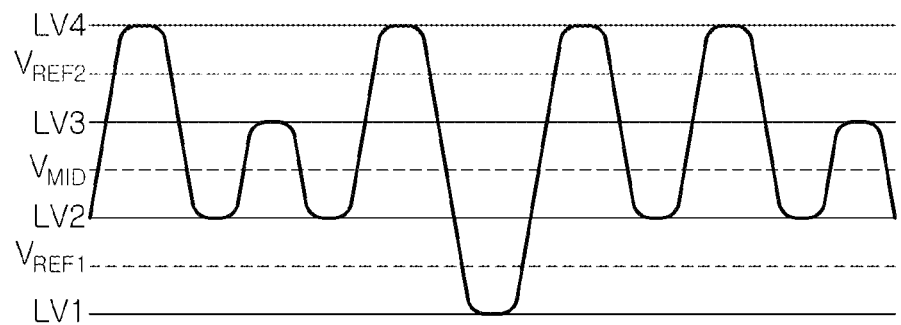
FIG. 18 is a diagram provided to illustrate an operation of a memory device according to an example embodiment.

FIG. 18 may be an example of a multilevel signal received by the memory device 700 through the DQS pin P1. Referring to FIG. 15, a multilevel signal may have first to fourth levels LV1 to LV4 and may swing based on an intermediate reference signal $V_{MID}$. For example, the multilevel signal may increase or decrease while passing through the intermediate reference signal $V_{MID}$ for each transition period TP.

In an example embodiment, the multilevel signal illustrated in FIG. 18 may be a signal generated by the transmitter 150 described with reference to FIG. 8B. For example, when the data to be transmitted through the multilevel signal is 0, the lower bit (LSB) of the multilevel signal is input as is as the second control signal CTR2 of the second driver 152 so that the multilevel signal may have a second level LV2 or a third level LV3. When the data transmitted as the multilevel signal is 1, the low-order bit (LSB) of the multilevel signal is inverted and then input to the second driver 152 as a second control signal CTR2, so that the multilevel signal may have the first level LV1 or the fourth level LV4. Accordingly, in the example embodiment illustrated in FIG. 18, data transmitted as a multilevel signal may be [010001110100].

Data included in the multilevel signal according to the example embodiment illustrated in FIG. 18 may be restored by the decoder 250 as described above with reference to FIG. 9. As an example, operations of the sense amplifiers 241 to 243 and the decoder 250 for restoring data from a multilevel signal according to the example embodiment illustrated in FIG. 18 may be as illustrated in Table 3 below.

TABLE 3

| $CLK_{EXT}$ | 11 | 01 | 10 | 01 | 11 | 00 | 11 | 01 | 11 | 01 | 10 |
|---|---|---|---|---|---|---|---|---|---|---|---|
| DATA | 1 | 0 | 0 | 0 | 1 | 1 | 1 | 0 | 1 | 0 | 0 |
| CLK | 1 | 0 | 1 | 0 | 1 | 0 | 1 | 0 | 1 | 0 | 1 |
| D0 | 1 | 1 | 1 | 1 | 1 | 0 | 1 | 1 | 1 | 1 | 1 |
| D1 | 1 | 0 | 0 | 0 | 1 | 0 | 1 | 0 | 1 | 0 | 0 |
| ED | 0 | 0 | 0 | 0 | 0 | 1 | 0 | 0 | 0 | 0 | 0 |
| OD | 1 | 0 | 0 | 0 | 1 | 0 | 1 | 0 | 1 | 0 | 0 |

Figure 19:
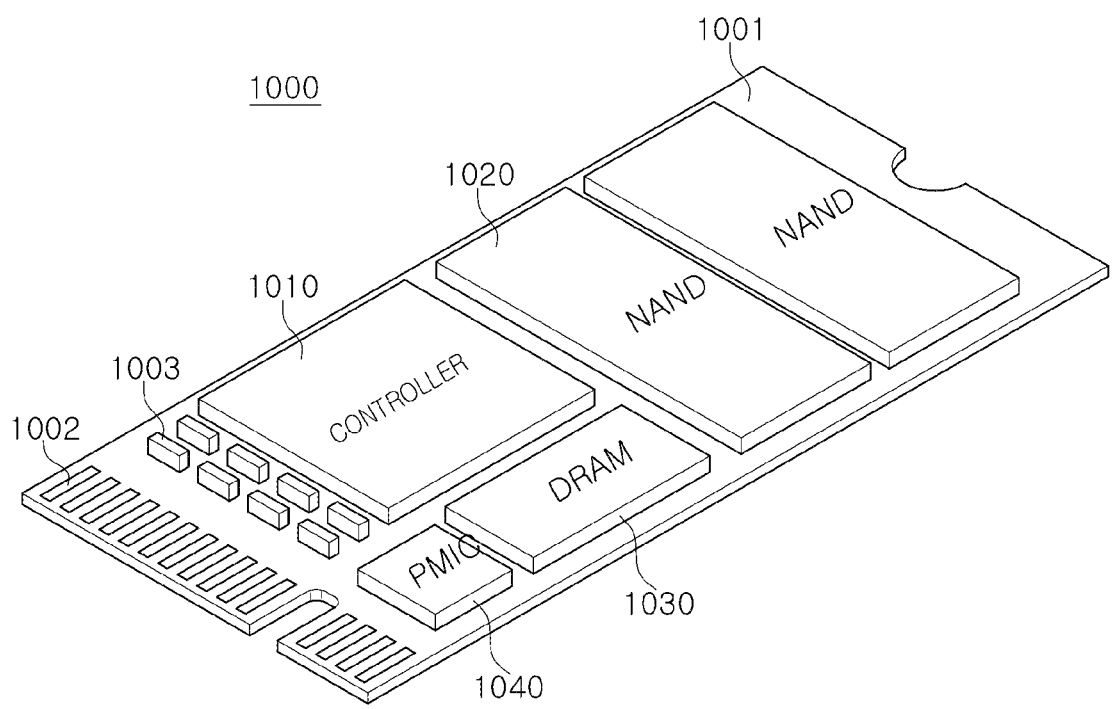
FIG. 19 is a schematic diagram of a memory system according to an example embodiment.

FIG. 19 is a schematic diagram of a memory system according to an example embodiment.

A memory system 1000 according to an example embodiment illustrated in FIG. 19 may be a solid state drive (SSD). The memory system 1000 may have a form factor according to the M.2 standard, and may communicate with an external central processing unit, a system-on-chip, an application processor, and the like according to a Peripheral Component Interconnect Express (PCIe) protocol.

The memory system 1000 may include a system board 1001, connector pins 1002 and component elements 1003 formed on the system board 1001, a controller 1010 mounted on the system board 1001, a NAND memory 1020, a DRAM 1030, a PMIC 1040, and the like. The connector pins 1002 may contact pins of a computer device and/or a server device to which the memory system 1000 is mounted. The component elements 1003 may include passive elements such as resistors and capacitors required for the operation of the memory system 1000.

The controller 1010 may control the memory system 1000 according to a control command from a computer device and/or a server device. The controller 1010 may store data received through the connector pins 1002 in the NAND memory 1020 and/or the DRAM 1030, or may read data stored in the NAND memory 1020 and/or the DRAM 1030 to output the read data to a computer device and/or a server device. The PMIC 1040 may distribute power received through the connector pins 1002 to the controller 1010, the NAND memory 1020, the DRMA 1030 and the like.

The controller 1010 may be connected to the NAND memory 1020 and the DRAM 1030 through wirings formed on the system substrate 1001. For example, the controller 1010 may generate a data signal or the like in a pulse amplitude modulation method and transmit the generated signal to the NAND memory 1020 and/or the DRAM 1030. The multilevel receiver of the NAND memory 1020 and/or the DRAM 1030 that receives a pulse amplitude modulation type data signal or the like may operate in synchronization with a clock signal received from the controller 1010.

As previously described with reference to FIGS. 1 to 18, the NAND memory 1020 and/or the DRAM 1030 may receive signals other than a data signal, for example, receive a clock signal and a data strobe signal as a multilevel signal. The controller 1010 may encode data in a clock signal, a data strobe signal and the like and may transmit the encoded data to the NAND memory 1020 and/or the DRAM 1030. The NAND memory 1020 and/or the DRAM 1030 may restore data by decoding a multilevel signal. Accordingly, separate pins and transmitters, and receivers for sending and receiving data encoded as multilevel signals may be omitted.

Figure 20:
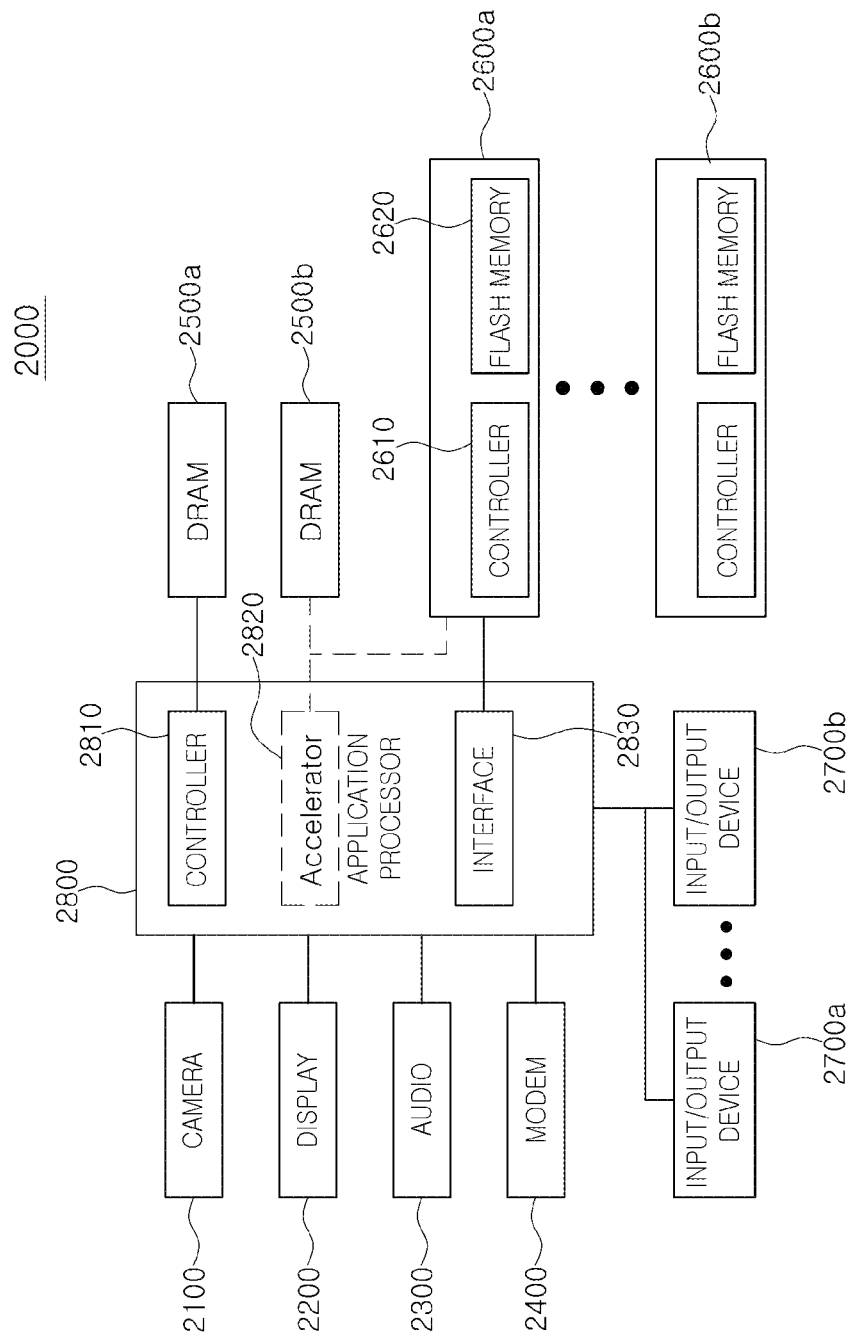
FIG. 20 is a schematic diagram of a mobile system including a memory device according to an example embodiment.

FIG. 20 is a block diagram schematically illustrating a mobile system including a memory device according to an example embodiment.

Referring to FIG. 20, a mobile system 2000 may include a camera 2100, a display 2200, an audio processing unit 2300, a modem 2400, DRAMs 2500a and 2500b, flash memory devices 2600a and 2600b, and input/output devices 2700a and 2700b, and an application processor ("AP") 2800.

The mobile system 2000 may be implemented as a laptop computer, a portable terminal, a smartphone, a tablet PC, a wearable device, a healthcare device, or an Internet-of-Things (IoT) device. In addition, the mobile system 2000 may be implemented as a server or a personal computer.

The camera 2100 may capture a still image or a video under the user's control. The mobile system 2000 may acquire specific information using a still image/video captured by the camera 2100 or may convert the still image/video into another type of data such as text and store the data. According to some example embodiments, the mobile system 2000 may recognize a character string included in a still image/video photographed by the camera 2100 and provide a text or audio translation corresponding to the character string. As such, the field of use of the camera 2100 in the mobile system 2000 is increasingly diversified. In an example embodiment, the camera 2100 may transmit data such as a still image/video to the AP 2800 according to a D-Phy or C-Phy interface based on the MIPI standard.

The display 2200 may be implemented in various forms such as a liquid crystal display (LCD), an organic light emitting diodes (OLED) display, active-matrix organic light-emitting diode (AM-OLED), plasma display panel (PDP), field emission display (FED), or electronic paper. In an example embodiment, the display 2200 may also be used as an input device of the mobile system 2000 by providing a touch screen function. In addition, the display 2200 may be provided integrally with a fingerprint sensor or the like to provide a security function of the mobile system 2000. In an example embodiment, the AP 2800 may transmit image data to be displayed on the display 2200, to the display 2200, according to a D-Phy or C-Phy interface based on the MIPI standard.

The audio processing unit 2300 may process audio data stored in the flash memory devices 2600a and 2600b or audio data included in content received externally through the modem 2400 or the input/output devices 2700a and 2700b. For example, the audio processing unit 2300 may perform various processes such as coding/decoding, amplification, and noise filtering for audio data.

The modem 2400 modulates and transmits signals to transmit/receive wired/wireless data, and demodulates signals received externally to restore the original signal. The input/output devices 2700a and 2700b are devices that provide digital input/output, and may include a port that may be connected to an external recording medium, an input device such as a touch screen, a mechanical button key or the like, an output device outputting vibrations in a haptic or other schemes, and the like. In some examples, the input/output devices 2700a and 2700b may be connected to an external recording medium through ports such as a USB, lightning cable, SD card, micro SD card, DVD, network adapter, or the like.

The AP 2800 may control the overall operation of the mobile system 2000. In detail, the AP 2800 may control the display 2200 such that a part of the contents stored in the flash memory devices 2600a and 2600b is displayed on the screen. In addition, when the user input is received through the input/output devices 2700a and 2700b, the AP 2800 may perform a control operation corresponding to the user input.

The AP 2800 may be provided as a system-on-chip (SoC) driving an application program, an operating system (OS), or the like. Also, the AP 2800 may be included in one semiconductor package and other devices included in the mobile system 2000, for example, the DRAM 2500a, a flash memory 2620, and/or a memory controller 2610. For example, the AP 2800 and at least one or more devices may be provided in the form of a package, such as Package on Package (PoP), Ball grid arrays (BGAs), Chip scale packages (CSPs), System-In-Package (SIP), Multi Chip Package (MCP), Wafer-level Fabricated Package (WFP), Wafer-Level Processed Stack Package (WSP), or the like. The kernel of the operating system running on the AP 2800 may include a device driver for controlling the flash memory devices 2600a and 2600b and an input/output scheduler. The device driver may control the access performance of the flash memory devices 2600a and 2600b by referring to the number of synchronous queues managed by the input/output scheduler, or may control the CPU mode inside the SoC, Dynamic Voltage and Frequency Scaling (DVFS) level, or the like.

In an example embodiment, the AP 2800 may include a processor block that executes an operation or drives an application program and/or an operating system, and various other peripheral components connected to a processor block through a system bus. Peripheral components may include a memory controller, internal memory, power management block, error detection block, monitoring block and the like. The processor block may include one or more cores, and in the case in which a plurality of cores are included in the processor block, each of the cores includes a cache memory, and a common cache shared by the cores may be included in the processor block.

In an example embodiment, the AP 2800 may also include an Accelerator block 2820 that is a dedicated circuit for AI data computation. According to some example embodiments, a separate accelerator chip may be provided separately from the AP 2800, and a DRAM 2500b may be additionally connected to the accelerator block 2820 or the accelerator chip. The accelerator block 2820 is a function block that professionally performs a specific function of the AP 2800, and includes a Graphics Processing Unit (GPU) that is a functional block and specializes in processing graphic data, a Neural Processing Unit (NPU) which is a block for professionally performing AI calculation and inference, a Data Processing Unit (DPU) which is a block specializing in data transmission, and the like.

According to an example embodiment, the mobile system 2000 may include a plurality of DRAMs 2500a and 2500b. In an example embodiment, the AP 2800 may include a controller 2810 controlling the DRAMs 2500a and 2500b, and the DRAM 2500a may be directly connected to the AP 2800.

The AP 2800 controls DRAM by setting commands and Mode Register Set (MRS) conforming to the JEDEC standard, or may perform communications by setting specifications and functions, such as low voltage/high speed/reliability, required by the mobile system 2000 and DRAM interface protocol for CRC/ECC. For example, the AP 2800 may communicate with the DRAM 2500a through an interface conforming to JEDEC standard standards such as LPDDR4, LPDDR5 or the like. According to some example embodiments, the AP 2800 sets a new DRAM interface protocol to control the DRAM 2500b for an accelerator, having a higher bandwidth than that of the DRAM 2500a, by the accelerator block 2820 or an accelerator chip provided separately from the AP 2800, thereby performing communications.

Although only DRAMs 2500a and 2500b are illustrated in FIG. 20, the configuration of the mobile system 2000 is not necessarily limited to this type, an memories other than DRAMs 2500a and 2500b may also be included in the mobile system 2000 depending on the bandwidth, response speed, and voltage conditions of the AP 2800 or the accelerator block 2820. In an example, the controller 2810 and/or the accelerator block 2820 may control various memories such as PRAM, SRAM, MRAM, RRAM, FRAM, Hybrid RAM, and the like. The DRAMs 2500a and 2500b have relatively low latency and high bandwidth than the input/output devices 2700a and 2700b or the flash memory devices 2600a and 2600b. The DRAMs 2500a and 2500b may be initialized at the power-on time point of the mobile system 2000, and when the operating system and application data are loaded, the DRAMs 2500a and 2500b may be used as temporary storage locations for the operating system and application data or as execution spaces for various software codes.

In the DRAMs 2500a and 2500b, addition/subtraction/multiplication/dividing arithmetic operations and vector operations, address operations, or FFT operations data may be stored. In another embodiment, the DRAMs 2500a and 2500b may be provided as a processing-in-memory (PIM) equipped with a calculation function. For example, a function for performing a function used for inference in the DRAMs 2500a and 2500b may be performed. In this case, the inference may be performed in a deep learning algorithm using an artificial neural network. The deep learning algorithm may include a training operation of training a model through various data and an inference operation of recognizing data with the trained model. For example, the function used for the inference may include a hyperbolic tangent function, a sigmoid function, and a rectified linear unit (ReLU) function.

As an example embodiment, an image captured through the camera 2100 by a user may be signal-processed and stored in the DRAM 2500b, and the accelerator block 2820 or accelerator chip may perform AI data operation of recognizing data using data stored in the DRAM 2500b and the function used for inference.

According to an example embodiment, the mobile system 2000 may include a plurality of storage or a plurality of flash memory devices 2600a and 2600b having a greater capacity than the DRAMs 2500a and 2500b. The flash memory devices 2600a and 2600b may include the memory controller 2610 and the flash memory 2620. The memory controller 2610 receives control commands and data from the AP 2800, writes data to the flash memory 2620 in response to the control command, or reads data stored in the flash memory 2620 to access the AP 2800 and may transmit the data to the AP 2800.

According to an example embodiment, the accelerator block 2820 or the accelerator chip may perform training operations and AI data calculation using the flash memory devices 2600a and 2600b. In an example embodiment, operation logic capable of executing a desired (or alternatively, predetermined) operation inside the flash memory devices 2600a and 2600b may be implemented in the controller 2610, and the operation logic may execute at least a portion of the training operations and the operation of the inference AI data performed by the AP 2800 and/or the accelerator block 2820, in place, using the data stored in the flash memory 2620.

In an example embodiment, the AP 2800 may include an interface 2830, and accordingly, the flash memory devices 2600a and 2600b may be directly connected to the AP 2800. For example, the AP 2800 may be implemented as a SoC, the flash memory device 2600a may be implemented as a separate chip from the AP 2800, and the AP 2800 and the flash memory device 2600a may be mounted in one package. However, the example embodiments are not limited thereto, and the plurality of flash memory devices 2600a and 2600b may be electrically connected to the mobile system 2000 through a connection.

The flash memory devices 2600a and 2600b may store data such as still images/movies captured by the camera 2100, or may store data received through a communication network and/or ports included in the input/output devices 2700a and 2700b, and for example, may store Augmented Reality/Virtual Reality, High Definition (HD), or Ultra High Definition (UHD) contents.

At least some of the camera 2100, the display 2200, the audio processing unit 2300, the modem 2400, the DRAMs 2500a and 2500b, the flash memory devices 2600a and 2600b, the input/output devices 2700a and 2700b, and the AP 2800, included in the mobile system 2000 described with reference to FIG. 20, may exchange multilevel signals with each other. For example, the AP 2800 may exchange multilevel signals with at least one of other components. Devices that transmit and receive multilevel signals may transmit and receive data through a multilevel signal using at least one of the example embodiments described with reference to FIGS. 1 to 14 above. For example, the multilevel signal may be a clock signal other than a data signal, or a control signal for notifying the transmission timing of data.

As set forth above, according to an example embodiment, a clock signal and/or a data strobe signal is received from an external controller as a multilevel signal generated by a method such as pulse amplitude modulation or the like, and the received signal is decoded, thereby restoring original data. Accordingly, by omitting a separate pin for transmitting original data between a controller and a memory device, the number of pins may be reduced, thereby improving the integration degree of a memory device and lowering power consumption.

Various elements (e.g., first/second output circuit, clock generator/receiver, first/second multilevel receiver, core circuit, delay circuit, various decoders, various encoders, driver, multiplexer, data output unit, DQS output circuit, data input/output circuit, command/address signal generator, DQS receiver, data transceiver, clock receiver, various transmitters, and command/address signal receiver) disclosed in the present disclosure as black boxes may be implemented as processing circuitry such as hardware including logic circuits or a combination of hardware and software such as a processor executing software. For example, the processing circuitry may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While example embodiments have been illustrated and described above, it will be apparent to those skilled in the art that modifications and variations could be made without departing from the scope of the present inventive concept as defined by the appended claims.

What is claimed is:

1. A method of operating a memory device, comprising:
   receiving a multilevel signal having M levels transmitted by an external controller through a clock receiving pin, where M is a natural number greater than 2;
   decoding the multilevel signal to restore at least one of Data Bus inversion (DBI) data, Data Mask (DM) data, Cyclic Redundancy Check (CRC) data, or Error Correction Code (ECC) data; and
   generating a first output signal having a first logic value or a second value based on the multilevel signal and a first reference signal and generating a second output signal having the first logic value or the second logic value based on the multilevel signal and a second reference signal, the first logic value being different from the second logic value,
   wherein the multilevel signal is a clock signal transmitted by the external controller, and is a signal swinging based on an intermediate reference signal having an intermediate level between a minimum level and a maximum level among the M levels, and
   wherein at least one of the DBI data, the DM data, the CRC data, or the ECC data is restored using at least one of the first output signal or the second output signal.

2. The method of claim 1, further comprising:
   generating the first output signal having the first logic value when the multilevel signal is lower than the first reference signal, the first output signal having the second logic value when the multilevel signal is greater than the first reference signal, the second output signal having the first logic value when the multilevel signal is lower than the second reference signal greater than the first reference signal, and the second output signal having the second logic value when the multilevel signal is greater than the second reference signal.

3. The method of claim 1, each of the first output signal and the second output signal is a non-return zero (NRZ) signal.

4. The method of claim 1, wherein
   the M levels have a first level, a second level greater than the first level, a third level greater than the second level, and a fourth level greater than the third level, and
   a level of the first reference signal is an intermediate level between the first level and the second level, and a level of the second reference signal is an intermediate level between the third level and the fourth level.

5. The method of claim 1, further comprising:
   generating a delayed multilevel signal by delaying a phase of the multilevel signal,
   comparing the multilevel signal with the first reference signal and the second reference signal at each rising edge and each falling edge of the delayed multilevel signal.

6. The method of claim 1, further comprising:
   generating an internal clock signal based on the multilevel signal and the intermediate reference signal.

7. A method of operating a memory device, comprising:
   receiving a data strobe signal transmitted by an external controller through a DQS pin, the data strobe signal being a multilevel signal having M levels, where M is a natural number greater than 2;
   generating a first output signal having a first logic value or a second logic value based on the data strove signal and a first reference signal and generating a second output signal having the first logic value or the second logic value based on the data strobe signal and a second reference signal, the first logic value being different from the second logic value; and
   decoding the data strobe signal and restoring data that is encoded into the data strobe signal by the external controller,
   wherein the data strobe signal is a signal swinging based on an intermediate level between a minimum level and a maximum level among the M levels, and
   wherein the data is decoded using at least one of the first output signal or the second output signal.

8. The method of claim 7, further comprising:
   generating the first output signal having the first logic value when the data strobe signal is lower than the first reference signal, the first output signal having the second logic value when the data strobe signal is greater than the first reference signal, the second output signal having the first logic value when the data strobe signal is lower than the second reference signal that is greater than the first reference signal, and the second output signal having the second logic value when the data strobe signal is greater than the second reference signal.

9. The method of claim 8, wherein
the M levels have a first level, a second level greater than the first level, a third level greater than the second level, and a fourth level greater than the third level, and
a level of the first reference signal is an intermediate level between the first level and the second level, and a level of the second reference signal is an intermediate level between the third level and the fourth level.

10. The method of claim 8, wherein
the data strobe signal has a level greater than the first reference signal and lower than the second reference signal when the data is 0, and
the data strobe signal has a level lower than the first reference signal or greater than the second reference signal when the data is 1.

11. The method of claim 7, wherein the data includes at least one of DBI data, DM data, CRC data or ECC data.

12. A memory device comprising:
a buffer configured to receive a multilevel signal having M levels through a DQS pin, where M is a natural number greater than 2;
a delay circuit configured to generate a delayed clock signal by delaying the multilevel signal;
a first sense amplifier configured to generate a first output signal based on the multilevel signal and a first reference signal at a rising edge and a falling edge of the delayed clock signal;
a second sense amplifier configured to generate a second output signal based on the multilevel signal and a second reference signal greater than the first reference signal at the rising edge and the falling edge of the delayed clock signal; and
a decoder configured to restore at least one of DBI data, DM data, CRC data, or ECC data that is encoded into the multilevel signal, using at least one of the first output signal or the second output signal,
wherein the first output signal has a first logic value or a second logic value based on the multilevel signal and a first reference signal, and
the second output signal has a second output signal having the first logic value or the second logic value based on the multilevel signal and a second reference signal, the first logic value being different from the second logic value.

13. The memory device of claim 12, wherein the multilevel signal swings based on an intermediate reference signal, and the intermediate reference signal has a level different from a level of the first reference signal and a level of the second reference signal.

14. The memory device of claim 13, wherein the intermediate reference signal has a level greater than the level of the first reference signal and lower than the level of the second reference signal.

15. The memory device of claim 13, further comprising:
a DQS transmission circuit configured to restore a data strobe signal based on the multilevel signal and the intermediate reference signal.

16. The memory device of claim 13, wherein
the first output signal has the first logic value when the multilevel signal is lower than the first reference signal, and has the second logic value different from the first logic value when the multilevel signal is greater than the first reference signal, and
the second output signal has the first logic value when the multilevel signal is lower than the second reference signal, and has the second logic value when the multilevel signal is greater than the second reference signal.

17. The memory device of claim 12, wherein the decoder is configured to restore at least one of the DBI data, the DM data, the CRC data, or the ECC data by alternately selecting the first output signal and the second output signal for each period of the multilevel signal.

18. The memory device of claim 12, further comprising:
a clock buffer configured to receive an external clock signal having four levels; and
a multilevel receiver configured to restore data encoded with the external clock signal based on the external clock signal and at least one of a first clock reference signal or a second clock reference signal greater than the first clock reference signal.

19. The memory device of claim 18, wherein the external clock signal is a signal swinging based on an intermediate level between a minimum level and a maximum level among the four levels.

20. The memory device of claim 18, wherein the data encoded into the external clock signal is different from the data encoded into the multilevel signal.

* * * * *